(12) United States Patent
Kobayashi et al.

(10) Patent No.: US 11,662,663 B2
(45) Date of Patent: May 30, 2023

(54) SUBSTRATE PROTECTIVE FILM-FORMING COMPOSITION AND PATTERN FORMING PROCESS

(71) Applicant: Shin-Etsu Chemical Co., Ltd., Tokyo (JP)

(72) Inventors: Tomohiro Kobayashi, Joetsu (JP); Kenichi Oikawa, Joetsu (JP); Masayoshi Sagehashi, Joetsu (JP); Teppei Adachi, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 258 days.

(21) Appl. No.: 16/596,022

(22) Filed: Oct. 8, 2019

(65) Prior Publication Data

US 2020/0133123 A1 Apr. 30, 2020

(30) Foreign Application Priority Data

Oct. 30, 2018 (JP) .............................. JP2018-203522

(51) Int. Cl.
*G03F 7/038* (2006.01)
*G03F 7/09* (2006.01)
*G03F 7/004* (2006.01)

(52) U.S. Cl.
CPC ............ *G03F 7/038* (2013.01); *G03F 7/0043* (2013.01); *G03F 7/0048* (2013.01); *G03F 7/092* (2013.01)

(58) Field of Classification Search
CPC ... G03F 7/11; G03F 7/09; G03F 7/038; G03F 7/0382; G03F 7/039; G03F 7/0392
See application file for complete search history.

(56) References Cited

U.S. PATENT DOCUMENTS

| | | | |
|---|---|---|---|
| 9,091,914 B2 | 7/2015 | Hatakeyama | |
| 9,164,383 B2 | 10/2015 | Hatakeyama | |
| 9,310,684 B2 | 4/2016 | Meyers et al. | |
| 2008/0227037 A1* | 9/2008 | Hatakeyama | G03F 7/091 |
| | | | 430/323 |
| 2014/0363957 A1 | 12/2014 | Hatakeyama et al. | |
| 2015/0340246 A1* | 11/2015 | Woo | G03F 7/16 |
| | | | 430/323 |
| 2016/0363863 A1 | 12/2016 | Sakaida et al. | |
| 2017/0102612 A1 | 4/2017 | Meyers et al. | |
| 2018/0120706 A1* | 5/2018 | Shirakawa | G03F 7/325 |
| 2018/0164686 A1* | 6/2018 | Cui | G03F 7/26 |
| 2018/0180996 A1* | 6/2018 | Tsubaki | G03F 7/0758 |

FOREIGN PATENT DOCUMENTS

| | | |
|---|---|---|
| JP | 2015-018223 A | 1/2015 |
| JP | 5708521 B2 | 4/2015 |
| JP | 5708522 B2 | 4/2015 |
| TW | 201539141 A | 10/2015 |
| TW | 201702744 A | 1/2017 |

OTHER PUBLICATIONS

Office Action dated Mar. 31, 2021, issued in counterpart TW Application No. 108138759. (9 pages).
Stowers et al., "Directly patterned inorganic hardmask for EUV lithography", Proc. of SPIE, (2011), vol. 7969, 796915. Cited in Specification. (11 pages).
Office Action dated Jun. 29, 2021, issued in counterpart JP application No. 2018-203522, with English translation. (5 pages).

* cited by examiner

*Primary Examiner* — Duane Smith
*Assistant Examiner* — Nicholas E Brown
(74) *Attorney, Agent, or Firm* — WHDA, LLP

(57) ABSTRACT

A composition comprising (A) a polymer comprising recurring units (a1) having a carboxyl group protected with an acid labile group and recurring units (a2) having a cyclic ester, cyclic carbonate or cyclic sulfonate structure, (B) a thermal acid generator, and (C) an organic solvent is suited to form a protective film between a substrate and a resist film. Even when a metal-containing resist film is used, the protective film is effective for preventing the substrate from metal contamination.

15 Claims, No Drawings

SUBSTRATE PROTECTIVE FILM-FORMING COMPOSITION AND PATTERN FORMING PROCESS

CROSS-REFERENCE TO RELATED APPLICATION

This non-provisional application claims priority under 35 U.S.C. § 119(a) on Patent Application No. 2018-203522 filed in Japan on Oct. 30, 2018, the entire contents of which are hereby incorporated by reference.

TECHNICAL FIELD

This invention relates to a composition for forming a protective film between a substrate and a resist film for the purpose of preventing the substrate from being contaminated with any resist components.

BACKGROUND ART

In the recent drive for higher integration and operating speeds in LSI devices, the pattern rule is made drastically finer. As the advanced miniaturization technology, the ArF immersion lithography is applied to the mass scale manufacture of devices of 45 nm et seq node. Along with the ArF immersion lithography, the double pattering process is used in practice for the generation of 28 nm et seq node. It becomes possible to form a narrow pitch pattern beyond the optical limit. For the manufacture of devices of 20 nm et seq node, the multiple patterning process of repeating exposure and etching steps 3 or more times to form a pattern with a narrower pitch is under study. The multiple patterning process, however, requires more steps and encounters the problems of a drop of productivity by the extension of manufacturing duration or an increased frequency of defect formation, and a substantial increase of cost.

A recent focus is drawn on the extreme ultraviolet (EUV) lithography of wavelength 13.5 nm as a promising technology substituting for the combination of ArF immersion lithography and multiple patterning process. Using the EUV lithography, a fine size pattern having a half pitch of 25 nm or less can be formed through single exposure.

On the other hand, the EUV lithography strongly requires to increase the sensitivity of a resist material to compensate for an output shortage of the light source. The increased sensitivity, however, leads to an increase of shot noise, which in turn leads to increases of the edge roughness (LER or LWR) of a line pattern. It is one of the critical issues raised in the EUV lithography to meet both high sensitivity and low edge roughness.

As the attempt to provide the resist material with a high sensitivity or to reduce the influence of shot noise, it is currently investigated to use metal ingredients in the resist material. Since compounds of metal elements such as barium, titanium, hafnium, zirconium and tin have a high absorptivity to EUV as compared with metal-free organic materials, they are expected to achieve an improvement in the photosensitivity of resist material or a suppression of the influence of shot noise.

For example, studies are made on resist materials having added thereto metal salts or organic metal complexes as described in Patent Documents 1 and 2, and non-chemically amplified resist materials using nanoparticles of metal oxides as described in Patent Documents 3 and 4 and Non-Patent Document 1. However, it is pointed out that these metal-containing resist materials have the risk that metals originating from the resist materials can contaminate inorganic substrates or organic materials beneath the resist film. The metals can affect the electrical properties of the substrate material. In addition, during substrate processing by etching treatment, the etching rate differs between a contaminated area and the surrounding, which can cause formation of defects after etching.

CITATION LIST

Patent Document 1: JP 5708521
Patent Document 2: JP 5708522
Patent Document 3: U.S. Pat. No. 9,310,684
Patent Document 4: US 2017/0102612
Non-Patent Document 1: Proc. SPIE Vol. 7969, 796915 (2011)

SUMMARY OF INVENTION

An object of the invention is to provide a composition for forming a substrate protective film for preventing the substrate from metal contamination even when a metal-containing resist film is used.

The inventors have found that when a substrate protective film-forming composition comprising a polymer comprising recurring units having a carboxyl group protected with an acid labile group and recurring units having a cyclic ester, cyclic carbonate or cyclic sulfonate structure, a thermal acid generator, and an organic solvent is used and a specific treatment is applied, the resulting protective film is effective for preventing the resist film from contacting the substrate and for protecting the substrate from metal contamination. In addition, the protective film can be removed prior to an etching step.

In one aspect, the invention provides a composition for forming a protective film between a substrate and a resist film, the composition comprising
(A) a polymer comprising recurring units (a1) having a carboxyl group protected with an acid labile group and recurring units (a2) having a structure selected from a cyclic ester, cyclic carbonate, and cyclic sulfonate,
(B) a thermal acid generator, and
(C) an organic solvent.

In a preferred embodiment, the recurring units (a1) have the formula (a1):

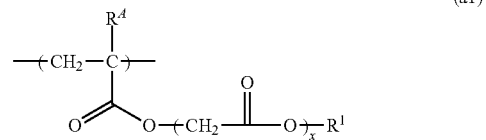

wherein $R^A$ is hydrogen or methyl, $R^1$ is an acid labile group, and x is 0 or 1.

In a preferred embodiment, the recurring units (a2) have the formula (a2):

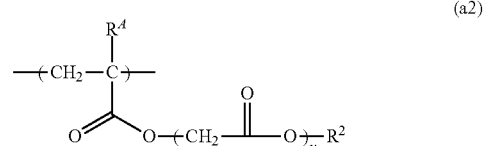

wherein $R^A$ is hydrogen or methyl, $R^2$ is a $C_4$-$C_{15}$ monovalent cyclic hydrocarbon group having a structure selected from a cyclic ester, cyclic carbonate, and cyclic sulfonate, and y is 0 or 1.

The polymer may further comprise recurring units (a3) having a carboxyl group.

In another aspect, the invention provides a pattern forming process comprising the steps of:

(i) applying the substrate protective film-forming composition defined above to a substrate to form a protective film thereon, (ii) applying a resist material on the protective film to form a resist film thereon, (iii) exposing the resist film to high-energy radiation, (iv) developing the exposed resist film in a developer, and (v) dissolving away the protective film in entirety or in a selected portion using an organic solvent or basic aqueous solution.

In a preferred embodiment, the developer used in step (iv) comprises at least 60% by weight of at least one organic solvent selected from the group consisting of 2-octanone, 2-nonanone, 2-heptanone, 3-heptanone, 4-heptanone, 2-hexanone, 3-hexanone, diisobutyl ketone, 2-methylcyclohexanone, 3-methylcyclohexanone, 4-methylcyclohexanone, acetophenone, 2'-methylacetophenone, 4'-methylacetophenone, butyl acetate, isobutyl acetate, pentyl acetate, isopentyl acetate, phenyl acetate, methyl valerate, methyl 2-hydroxyisobutyrate, ethyl 2-hydroxyisobutyrate, methyl benzoate, ethyl benzoate, benzyl acetate, methyl phenylacetate, and methyl 3-phenylpropionate.

In a typical embodiment, the resist film comprises at least 2% by weight of silicon, or one or more elements selected from the metals of the 4th, 5th and 6th periods in Periodic table.

Advantageous Effects of Invention

The pattern forming process using the substrate protective film-forming composition of the invention is effective for preventing the resist film from contacting the substrate for thereby protecting the substrate from metal contamination due to a metal-containing resist material.

DESCRIPTION OF PREFERRED EMBODIMENTS

As used herein, the singular forms "a," "an" and "the" include plural referents unless the context clearly dictates otherwise. "Optional" or "optionally" means that the subsequently described event or circumstances may or may not occur, and that description includes instances where the event or circumstance occurs and instances where it does not. The notation (Cn-Cm) means a group containing from n to m carbon atoms per group. In chemical formulae, the broken line designates a valence bond.

The abbreviations and acronyms have the following meaning.

EB: electron beam
EUV: extreme ultraviolet
Mw: weight average molecular weight
Mn: number average molecular weight
Mw/Mn: molecular weight distribution or dispersity
GPC: gel permeation chromatography
LER: line edge roughness It is understood that for some structures represented by chemical formulae, there can exist enantiomers and diastereomers because of the presence of asymmetric carbon atoms. In such a case, a single formula collectively represents all such isomers. The isomers may be used alone or in admixture.

Substrate Protective Film-Forming Composition

One embodiment of the invention is a composition for forming a protective film between a substrate and a resist film, the composition comprising (A) a polymer comprising recurring units (a1) having a carboxyl group protected with an acid labile group and recurring units (a2) having a structure selected from a cyclic ester, cyclic carbonate, and cyclic sulfonate, (B) a thermal acid generator, and (C) an organic solvent. As used herein, the term "substrate protective film" refers to a film formed between a substrate and a resist film.

(A) Polymer

Component (A) is a polymer comprising recurring units (a1) having a carboxyl group protected with an acid labile group and recurring units (a2) having a structure selected from a cyclic ester, cyclic carbonate, and cyclic sulfonate, the polymer being referred to as Polymer A.

In recurring units (a1), the acid labile group is selected from groups having the following formulae (L1) to (L8), but not limited thereto.

(L1)

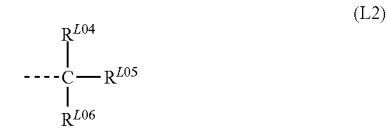

(L2)

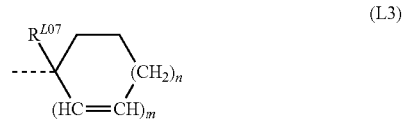

(L3)

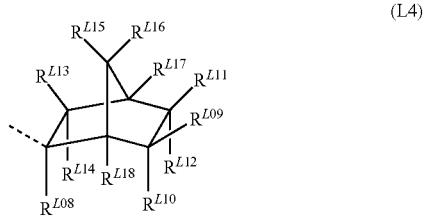

(L4)

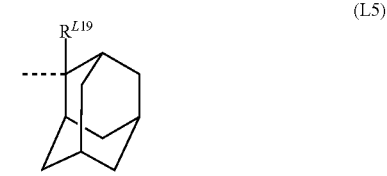

(L5)

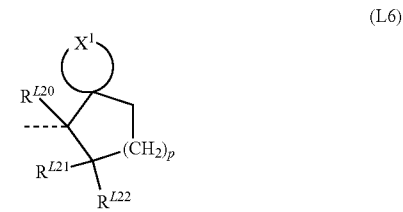

(L6)

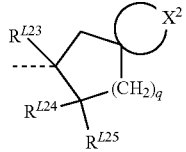

(L7)

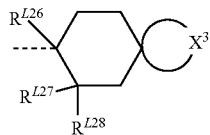

(L8)

In formula (L1), $R^{L01}$ and $R^{L02}$ are each independently hydrogen or a $C_1$-$C_{18}$, preferably $C_1$-$C_{10}$ alkyl group. The alkyl group may be straight, branched or cyclic and examples thereof include methyl, ethyl, propyl, isopropyl, n-butyl, sec-butyl, tert-butyl, cyclopentyl, cyclohexyl, 2-ethylhexyl, n-octyl, and adamantyl.

In formula (L1), $R^{L03}$ is a $C_1$-$C_{18}$, preferably $C_1$-$C_{10}$ monovalent hydrocarbon group which may contain a heteroatom. Suitable heteroatoms include oxygen, nitrogen and sulfur. Examples of the monovalent hydrocarbon group include straight, branched or cyclic alkyl groups and substituted forms of the foregoing in which some hydrogen is substituted by hydroxyl, alkoxy, oxo, amino, alkylamino or the like, or some carbon is replaced by a moiety containing a heteroatom such as oxygen. Suitable alkyl groups are as exemplified above for $R^{L01}$ and $R^{L02}$. Suitable substituted alkyl groups are shown below.

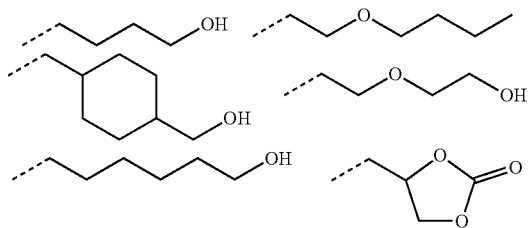

A pair of $R^{L01}$ and $R^{L02}$, $R^{L01}$ and $R^{L03}$, or $R^{L02}$ and $R^{L03}$ may bond together to form a ring with the carbon and oxygen atom to which they are attached. A ring-forming combination is a $C_1$-$C_{18}$, preferably $C_1$-$C_{10}$ straight or branched alkanediyl group.

In formula (L2), $R^{L04}$, $R^{L05}$ and $R^{L06}$ are each independently a $C_1$-$C_{15}$ alkyl group. The alkyl group may be straight, branched or cyclic, and examples thereof include methyl, ethyl, propyl, isopropyl, n-butyl, sec-butyl, tert-butyl, cyclopentyl, cyclohexyl, 2-ethylhexyl, n-octyl, 1-adamantyl, and 2-adamantyl.

In formula (L3), $R^{L07}$ is a $C_1$-$C_{10}$ alkyl group which may contain a heteroatom or a $C_6$-$C_{20}$ aryl group which may contain a heteroatom. The alkyl group may be straight, branched or cyclic and examples thereof include methyl, ethyl, propyl, isopropyl, n-butyl, sec-butyl, tert-butyl, n-pentyl, tert-pentyl, n-hexyl, cyclopentyl, cyclohexyl, and bicyclo[2.2.1]heptyl. In these groups, some hydrogen may be substituted by hydroxyl, alkoxy, carboxyl, alkoxycarbonyl, oxo, amino, alkylamino, cyano, mercapto, alkylthio, sulfo or the like, or some methylene may be replaced by an ether or thioether bond. Examples of the aryl group include phenyl, methylphenyl, naphthyl, anthryl, phenanthryl, and pyrenyl.

In formula (L3), m is an integer of 0 or 1, n is an integer of 0 to 3, and 2m+n is equal to 2 or 3.

In formula (L4), $R^{L08}$ is a $C_1$-$C_{10}$ alkyl group which may contain a heteroatom or a $C_6$-$C_{20}$ aryl group which may contain a heteroatom. Examples of the alkyl and aryl groups are the same as exemplified above for $R^{L07}$.

In formula (L4), $R^{L09}$ to $R^{L18}$ are each independently hydrogen or a $C_1$-$C_{15}$ monovalent hydrocarbon group. The monovalent hydrocarbon group may be straight, branched or cyclic. Examples include straight, branched or cyclic alkyl groups such as methyl, ethyl, propyl, isopropyl, n-butyl, sec-butyl, tert-butyl, n-pentyl, tert-pentyl, n-hexyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl and cyclohexylbutyl, and substituted forms of the foregoing in which some hydrogen is substituted by hydroxyl, alkoxy, carboxyl, alkoxycarbonyl, oxo, amino, alkylamino, cyano, mercapto, alkylthio, sulfo or the like. Alternatively, two of $R^{L09}$ to $R^{L18}$ may bond together to form a ring with the carbon atom to which they are attached (for example, a pair of $R^{L09}$ and $R^{L10}$, $R^{L09}$ and $R^{L11}$, $R^{L10}$ and $R^{L12}$, $R^{L11}$ and $R^{L12}$, $R^{L13}$ and $R^{L14}$, $R^{L15}$ and $R^{L16}$, or a similar pair). A ring-forming combination of R's is a divalent $C_1$-$C_{15}$ hydrocarbon group, examples of which are the ones exemplified above for the monovalent hydrocarbon groups, with one hydrogen atom being eliminated. Two of $R^{L09}$ to $R^{L18}$ which are attached to vicinal carbon atoms may bond together directly to form a double bond (for example, a pair of $R^{L09}$ and $R^{L11}$, $R^{L11}$ and $R^{L17}$, $R^{L15}$ and $R^{L17}$, or a similar pair).

In formula (L5), $R^{L19}$ is a $C_1$-$C_{10}$ alkyl group which may contain a heteroatom or a $C_6$-$C_{20}$ aryl group which may contain a heteroatom. Examples of the alkyl and aryl groups are as exemplified above for $R^{L07}$.

In formula (L6), $R^{L20}$ is a $C_1$-$C_{10}$ alkyl group which may contain a heteroatom or a $C_6$-$C_{20}$ aryl group which may contain a heteroatom. Examples of the alkyl and aryl groups are as exemplified above for $R^{L07}$. $R^{L21}$ to $R^{L22}$ are each independently hydrogen or a $C_1$-$C_{10}$ monovalent hydrocarbon group. The monovalent hydrocarbon group may be straight, branched or cyclic and examples thereof are as exemplified above for $R^{L09}$ to $R^{L18}$. $R^{L21}$ and $R^{L22}$ may bond together to form a substituted or unsubstituted cyclopentane or cyclohexane ring with the carbon atom to which they are attached. $X^1$ is a divalent group which forms a substituted or unsubstituted cyclopentane, cyclohexane or norbornane ring with the carbon atom to which it is attached. The subscript p is 1 or 2.

In formula (L7), $R^{L23}$ is a $C_1$-$C_{10}$ alkyl group which may contain a heteroatom or a $C_6$-$C_{20}$ aryl group which may contain a heteroatom. Examples of the alkyl and aryl groups are as exemplified above for $R^{L07}$. $R^{L24}$ and $R^{L25}$ are each independently hydrogen or a $C_1$-$C_{10}$ monovalent hydrocarbon group. The monovalent hydrocarbon group may be straight, branched or cyclic and examples thereof are as exemplified above for $R^{L09}$ to $R^{L18}$. $R^{L24}$ and $R^{L25}$ may bond together to form a substituted or unsubstituted cyclopentane or cyclohexane ring with the carbon atom to which they are attached. $X^2$ is a divalent group which forms a substituted or unsubstituted cyclopentane, cyclohexane or norbornane ring with the carbon atom to which it is attached. The subscript q is 1 or 2.

In formula (L8), $R^{L26}$ is a $C_1$-$C_{10}$ alkyl group which may contain a heteroatom or a $C_6$-$C_{20}$ aryl group which may contain a heteroatom. Examples of the alkyl and aryl groups are as exemplified above for $R^{L07}$. $R^{L27}$ and $R^{L28}$ are each independently hydrogen or a $C_1$-$C_{10}$ monovalent hydrocarbon group. The monovalent hydrocarbon group may be straight, branched or cyclic and examples thereof are as exemplified above for $R^{L09}$ to $R^{L18}$. $R^{L27}$ and $R^{L28}$ may bond together to form a substituted or unsubstituted cyclopentane or cyclohexane ring with the carbon atom to which they are attached. $X^3$ is a divalent group which forms a substituted or unsubstituted cyclopentane, cyclohexane or norbornane ring with the carbon atom to which it is attached.

Of the acid labile groups having formula (L1), the straight and branched ones are exemplified by the following groups, but not limited thereto.

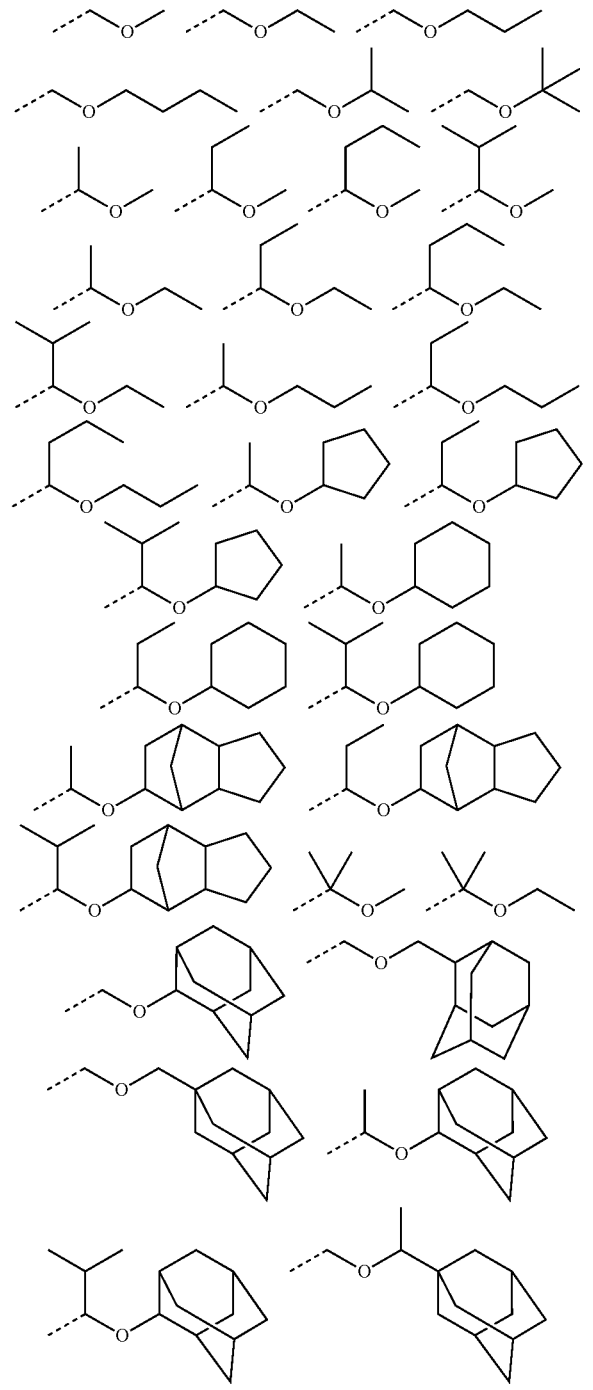

Of the acid labile groups having formula (L1), the cyclic ones are, for example, tetrahydrofuran-2-yl, 2-methyltetrahydrofuran-2-yl, tetrahydropyran-2-yl, and 2-ethyltetrahydropyran-2-yl.

Examples of the acid labile group having formula (L2) include tert-butyl, tert-pentyl and the groups shown below, but are not limited thereto.

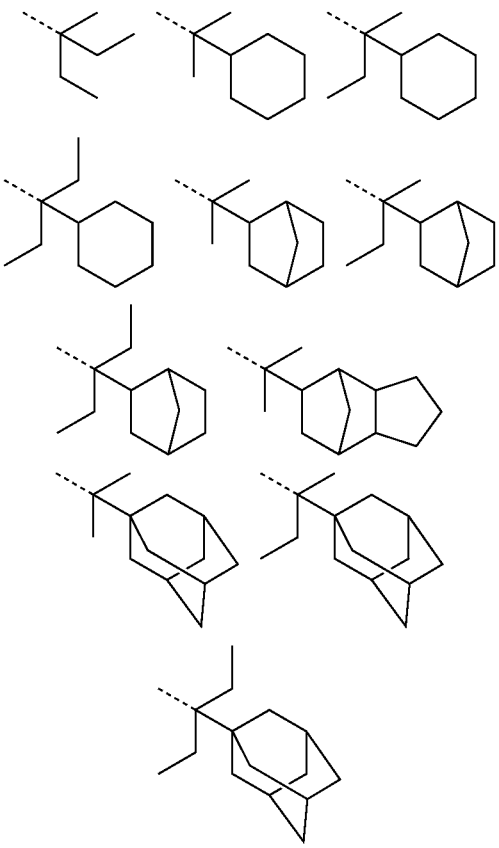

Examples of the acid labile group having formula (L3) include 1-methylcyclopentyl, 1-ethylcyclopentyl, 1-n-propylcyclopentyl, 1-isopropylcyclopentyl, 1-n-butylcyclopentyl, 1-sec-butylcyclopentyl, 1-cyclohexylcyclopentyl, 1-(4-methoxy-n-butyl)cyclopentyl, (bicyclo[2.2.1]heptan-2-yl) cyclopentyl, 1-(7-oxabicyclo[2.2.1]heptan-2-yl) cyclopentyl, 1-methylcyclohexyl, 1-ethylcyclohexyl, 3-methyl-1-cyclopenten-3-yl, 3-ethyl-1-cyclopenten-3-yl, 3-methyl-1-cyclohexen-3-yl, and 3-ethyl-1-cyclohexen-3-yl.

Of the acid labile groups having formula (L4), groups having the following formulae (L4-1) to (L4-4) are preferred.

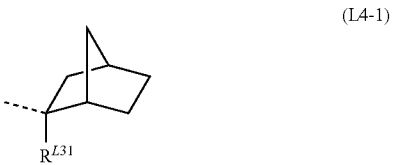

(L4-1)

(L4-2)

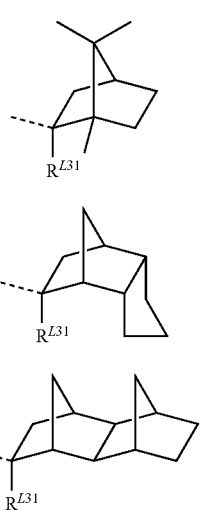

(L4-3)

(L4-4)

In formulas (L4-1) to (L4-4), the broken line denotes a bonding site and direction. $R^{L31}$ is each independently a $C_1$-$C_{10}$ monovalent hydrocarbon group. The monovalent hydrocarbon group may be straight, branched or cyclic, and examples thereof include alkyl groups such as methyl, ethyl, propyl, isopropyl, n-butyl, sec-butyl, tert-butyl, n-pentyl, tert-pentyl, n-hexyl, cyclopentyl and cyclohexyl.

For formulae (L4-1) to (L4-4), there can exist stereoisomers (enantiomers or diastereomers). Each of formulae (L4-1) to (L4-4) collectively represents all such stereoisomers. When the acid labile group is of formula (L4), there may be contained a plurality of stereoisomers.

For example, the formula (L4-3) represents one or a mixture of two selected from groups having the following formulas (L4-3-1) and (L4-3-2).

(L4-3-1)

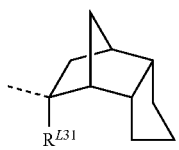

(L4-3-2)

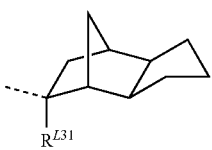

Herein $R^{L31}$ is as defined above.

Similarly, the formula (L4-4) represents one or a mixture of two or more selected to from groups having the following formulas (L4-4-1) to (L4-4-4).

(L4-4-1)

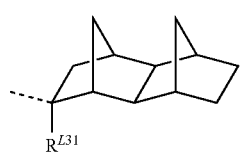

(L4-4-2)

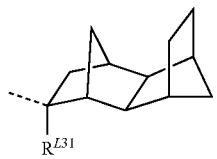

(L4-4-3)

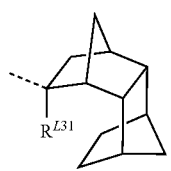

(L4-4-4)

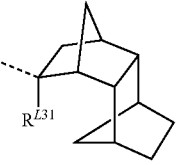

Herein $R^{L31}$ is as defined above.

Each of formulas (L4-1) to (L4-4), (L4-3-1) and (L4-3-2), and (L4-4-1) to (L4-4-4) collectively represents an enantiomer thereof and a mixture of enantiomers.

It is noted that in the above formulas (L4-1) to (L4-4), (L4-3-1) and (L4-3-2), and (L4-4-1) to (L4-4-4), the bond direction is on the exo side relative to the bicyclo[2.2.1] heptane ring, which ensures high reactivity for acid catalyzed elimination reaction (see JP-A 2000-336121). In preparing these monomers having a tertiary exo-alkyl group of bicyclo[2.2.1]heptane skeleton as a substituent group, there may be contained monomers substituted with an endo-alkyl group as represented by the following formulas (L4-1-endo) to (L4-4-endo). For good reactivity, an exo proportion of at least 50 mol % is preferred, with an exo proportion of at least 80 mol % being more preferred.

(L4-1-endo)

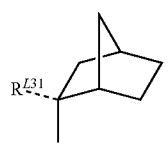

(L4-2-endo)

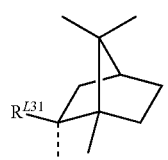

(L4-3-endo)

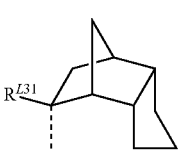

(L4-4-endo)

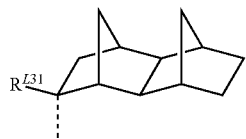

Herein R^{L31} is as defined above.

Illustrative, non-limiting examples of the acid labile group having formula (L4) are given below.

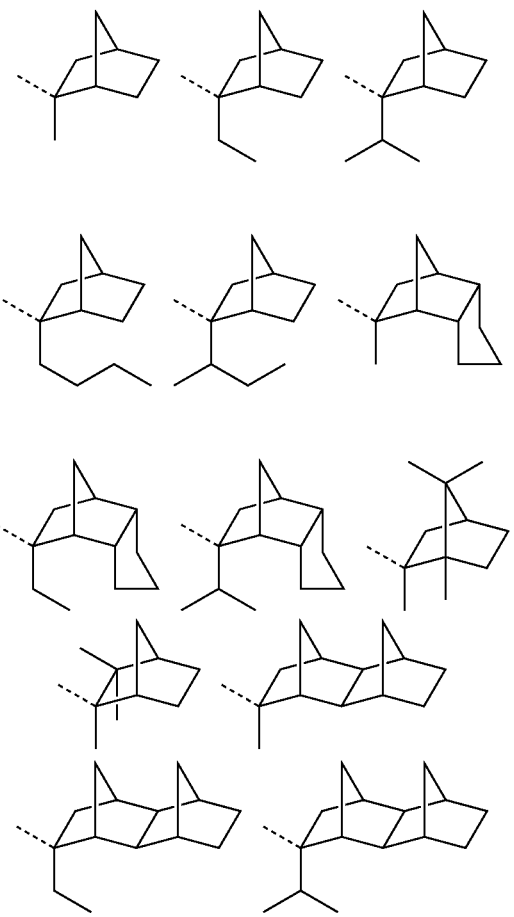

Illustrative, non-limiting examples of the acid labile group having formula (L5) are given below.

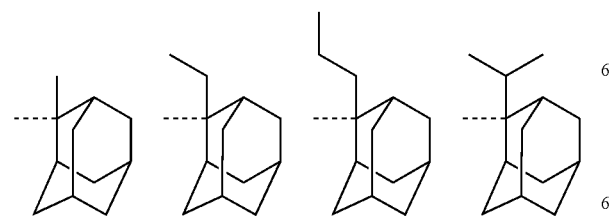

Illustrative, non-limiting examples of the acid labile group having formula (L6) are given below.

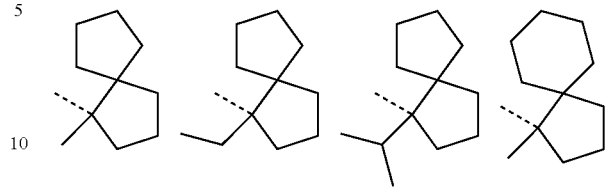

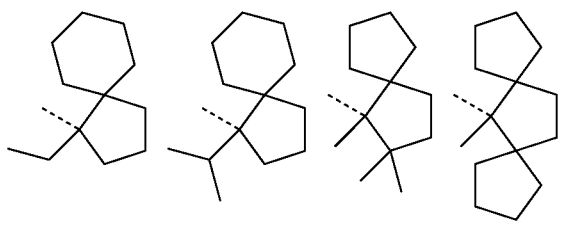

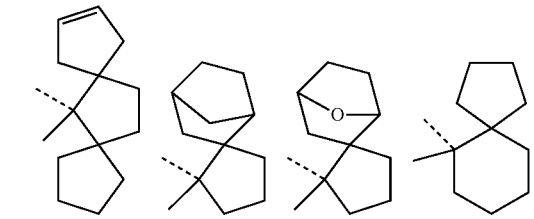

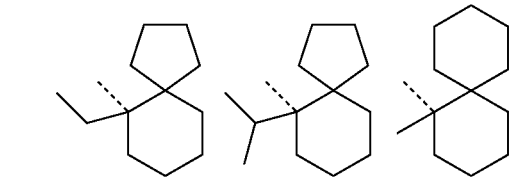

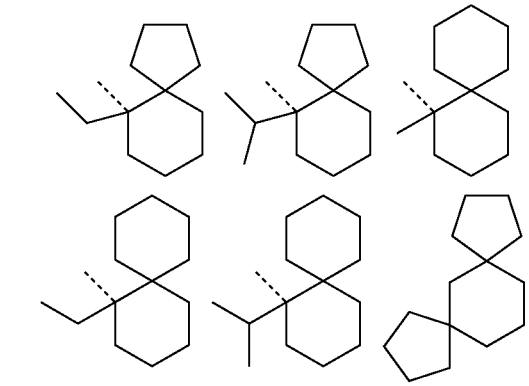

Illustrative, non-limiting examples of the acid labile group having formula (L7) are given below.

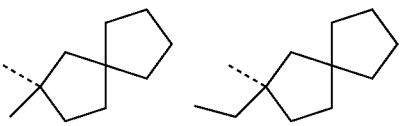

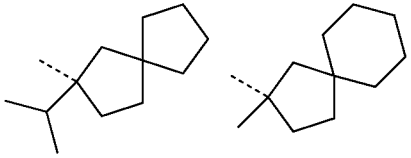

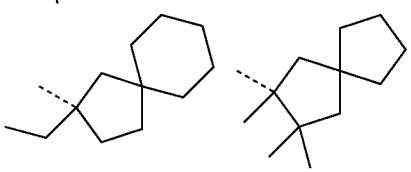

-continued

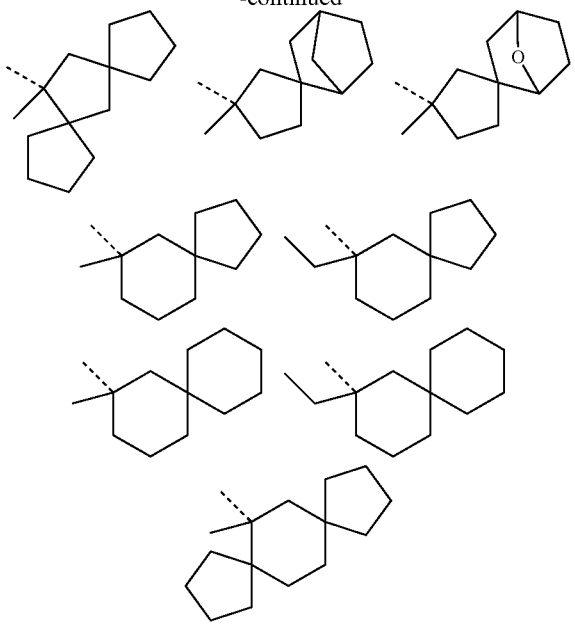

Illustrative, non-limiting examples of the acid labile group having formula (L8) are given below.

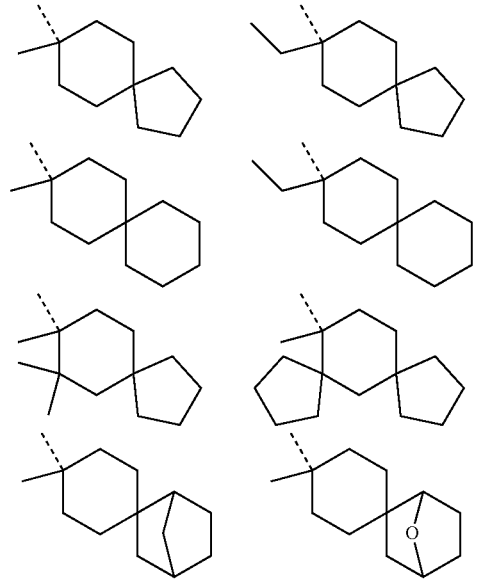

The structure of recurring unit (a1) is not particularly limited as long as the acid labile group is decomposed under the action of an acid, to generate a carboxylic acid.

A structure having the formula (a1) is preferred.

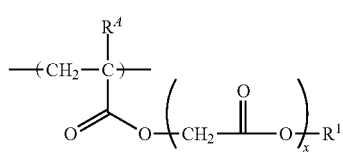
(a1)

Herein $R^A$ is hydrogen or methyl, $R^1$ is an acid labile group, and x is 0 or 1.

Illustrative examples of the recurring units (a1) are given below, but not limited thereto. Herein $R^A$ is as defined above.

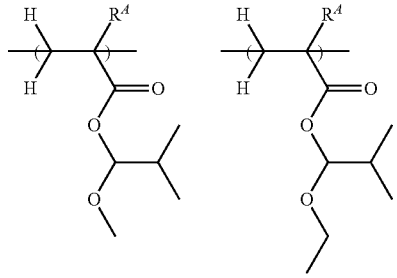

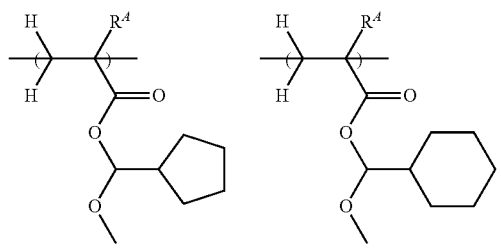

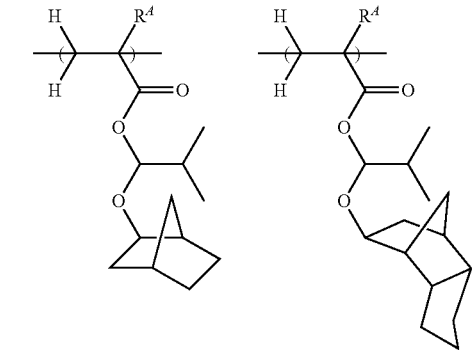

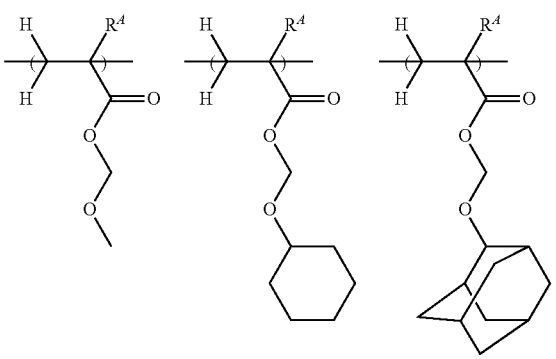

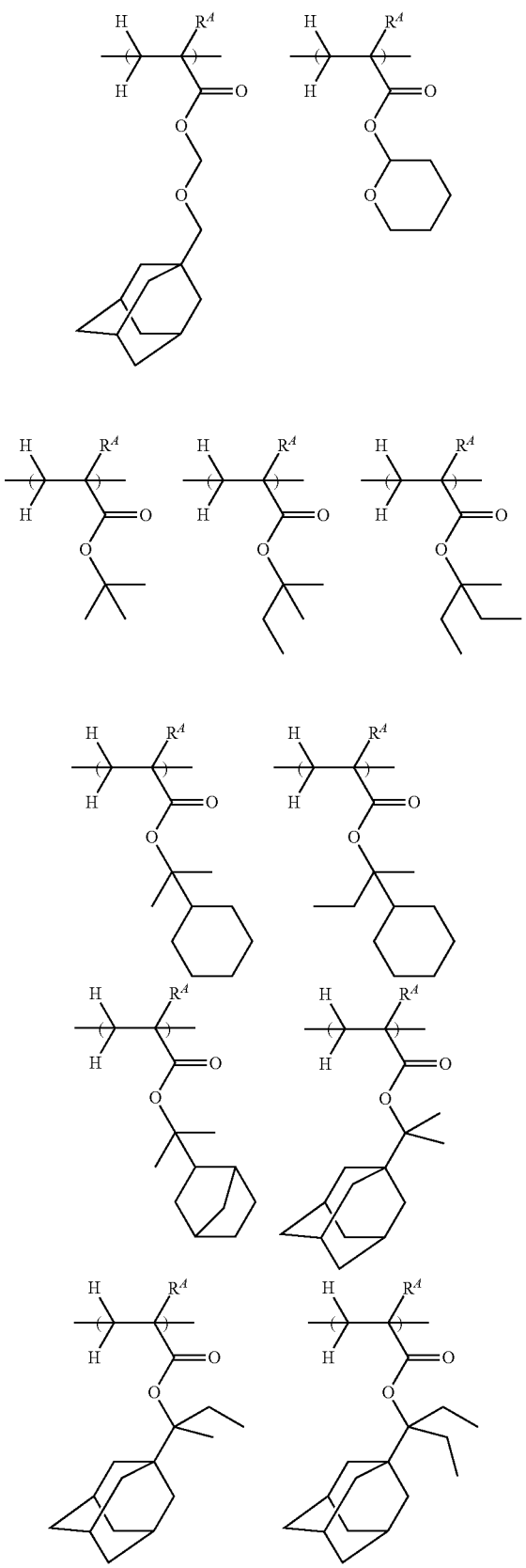
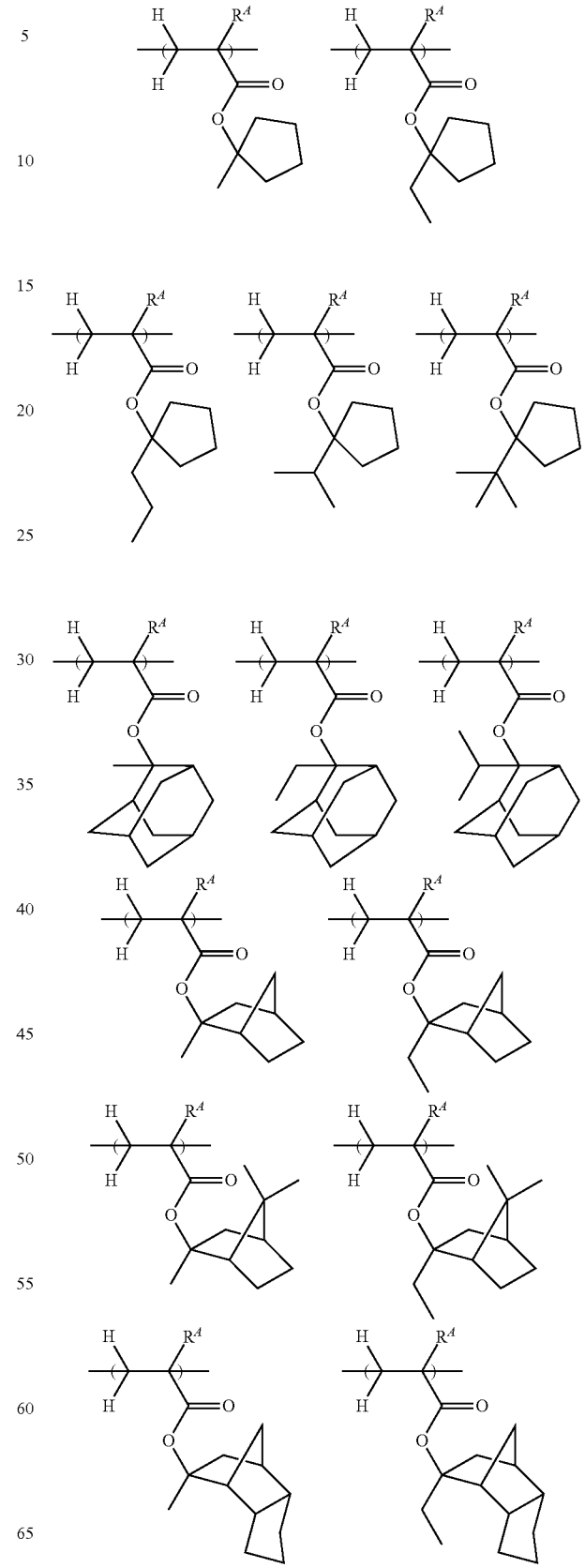

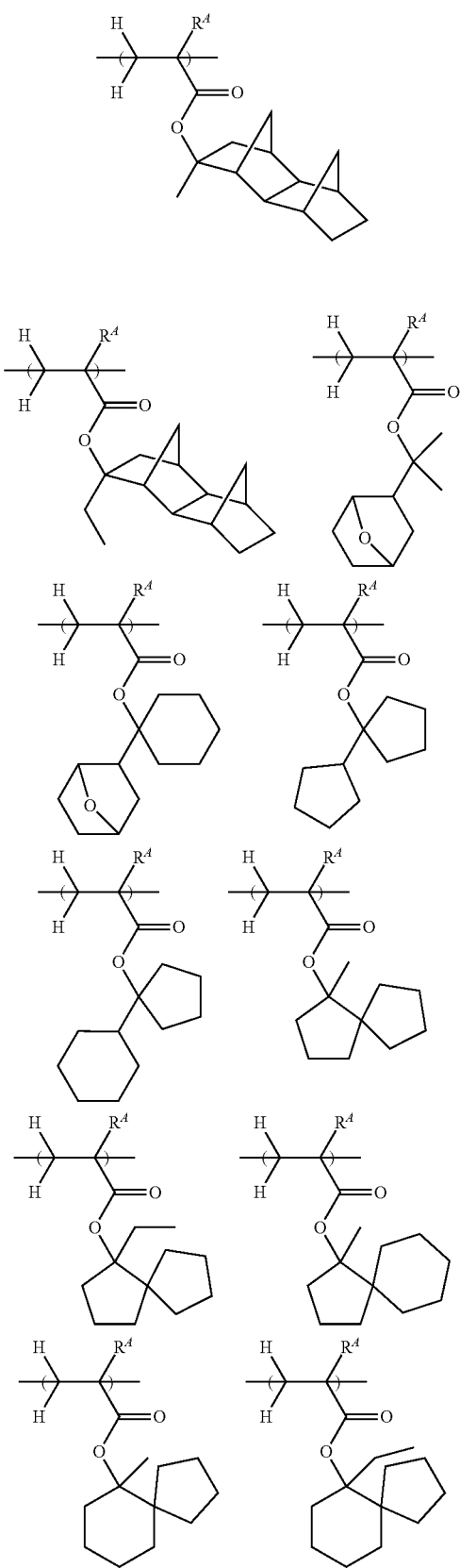
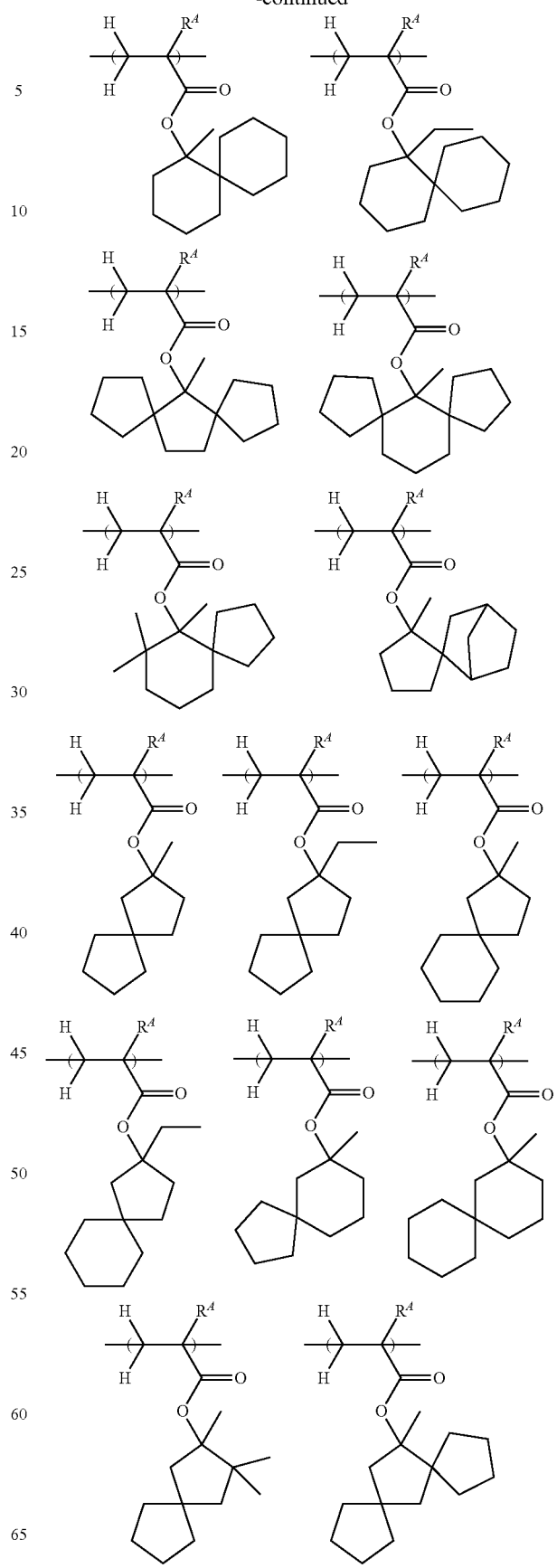

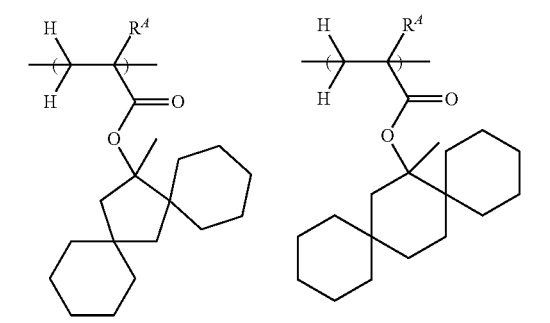
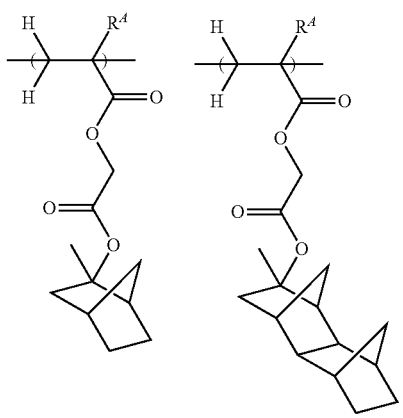

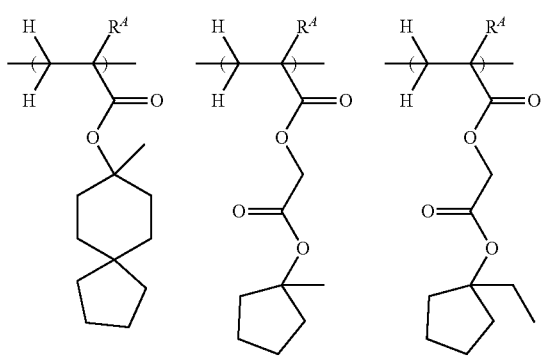

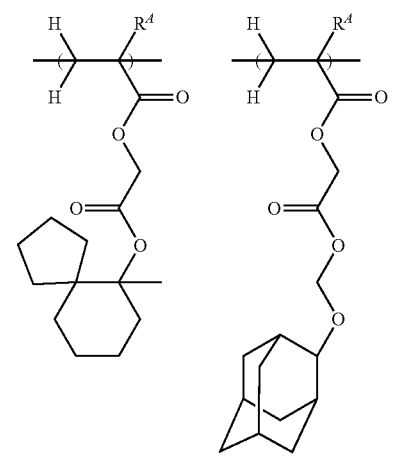

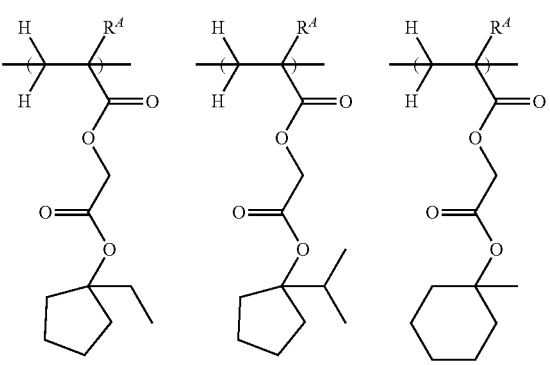

In Polymer A, the recurring units (a1) may be of one type or of two or more types.

Of the recurring units (a2) having a structure selected from a cyclic ester, cyclic carbonate, and cyclic sulfonate, a structure having the formula (a2) is preferred.

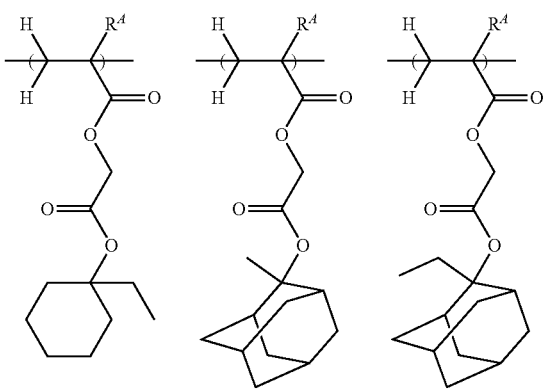

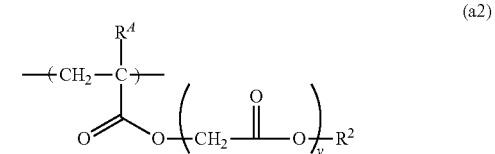

(a2)

In formula (a2), $R^A$ is hydrogen or methyl, $R^2$ is a $C_4$-$C_{15}$ monovalent cyclic hydrocarbon group having a structure selected from a cyclic ester, cyclic carbonate, and cyclic sulfonate, and y is 0 or 1.

Examples of the recurring unit (a2) are given below, but not limited thereto. Herein $R^A$ is as defined above.

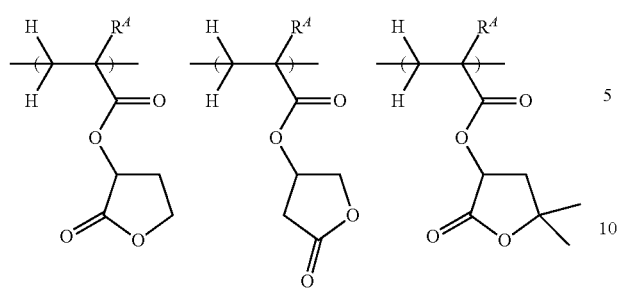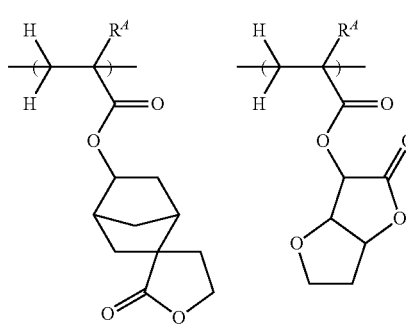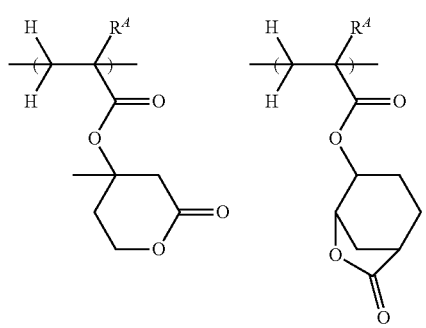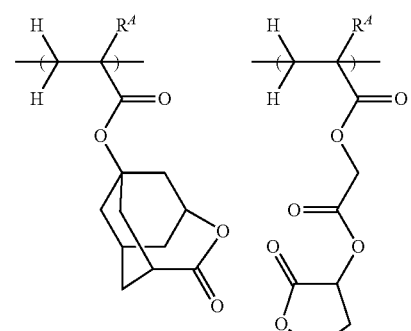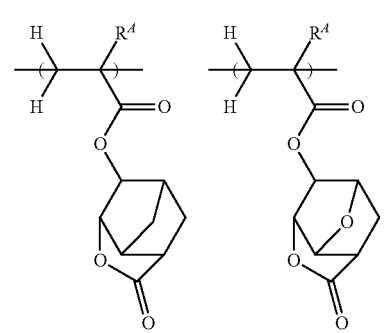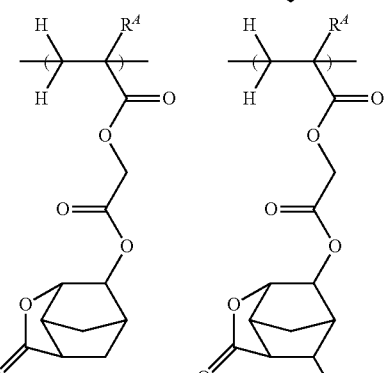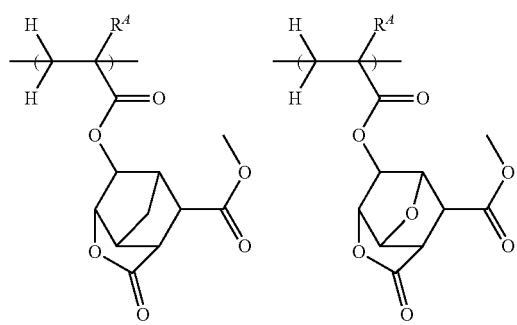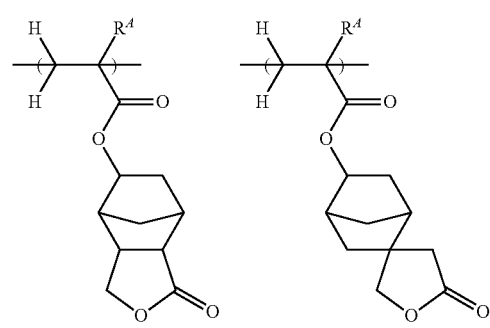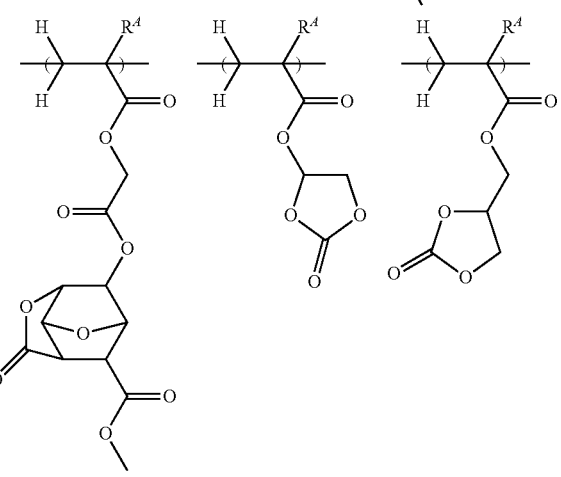

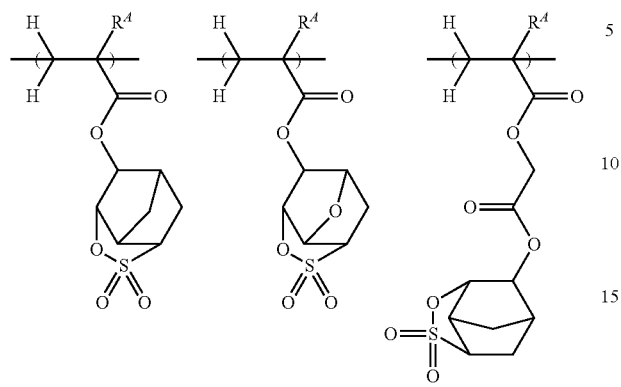

In Polymer A, the recurring units (a2) may be of one type or of two or more types.

Polymer A may further comprises recurring units (a3) having a carboxyl group. Inclusion of recurring units (a3) is preferred from the standpoint of resistance to resist solvent and developer. Examples of the recurring unit (a3) are given below, but not limited thereto. Herein $R^A$ is as defined above.

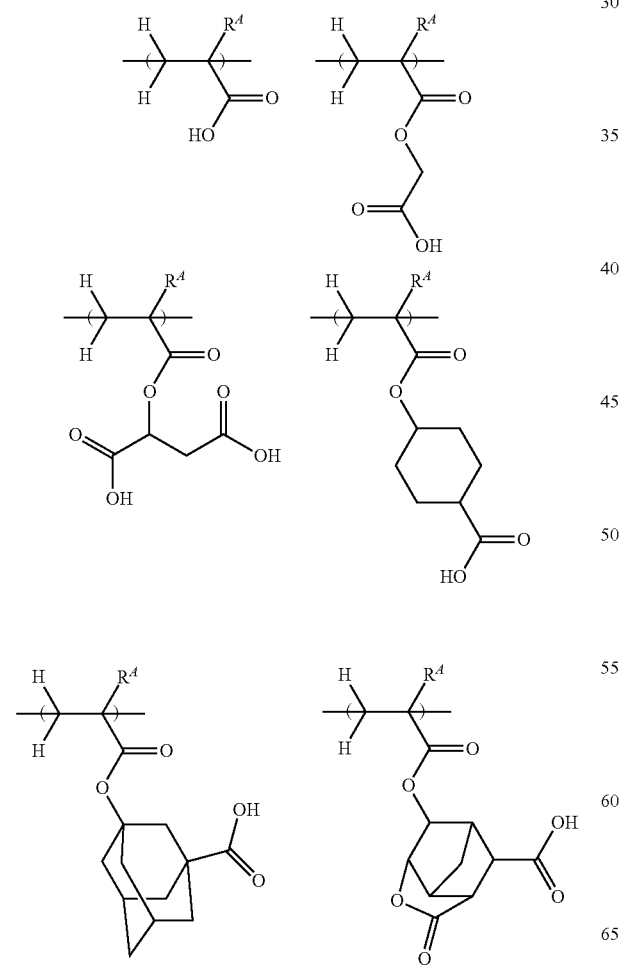

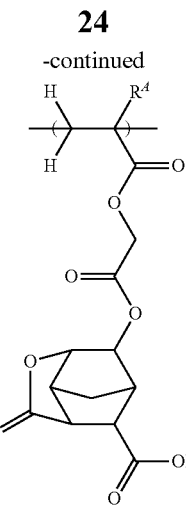

Polymer A may further comprises recurring units (a4) having a polar group such as hydroxyl, amino, amide, carbamate or cyano, but not an aromatic ring and/or recurring units (a5) having an aromatic ring.

Examples of the recurring unit (a4) are given below, but not limited thereto. Herein $R^A$ is as defined above.

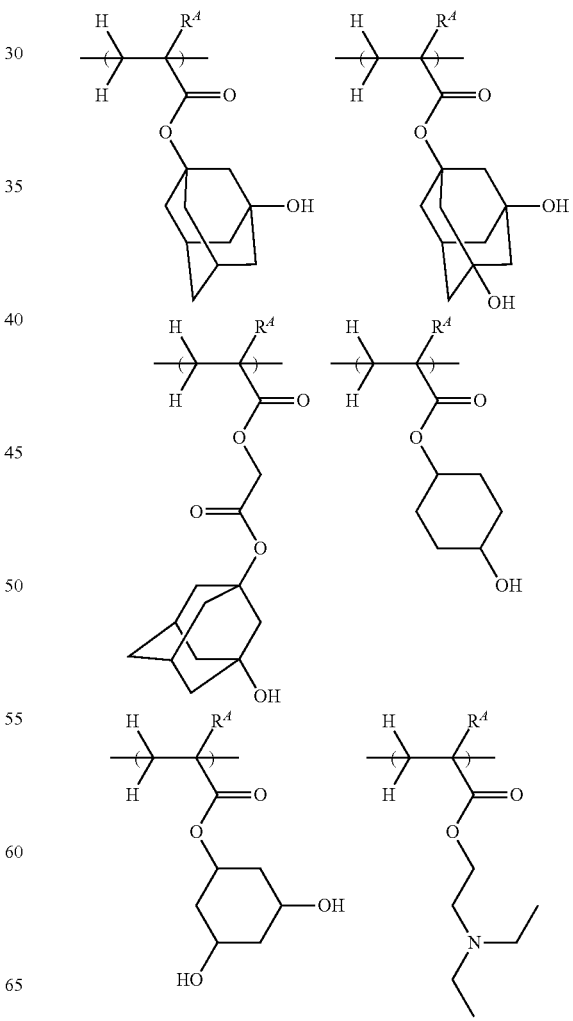

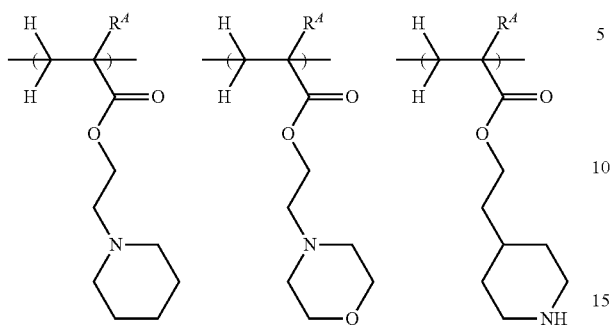
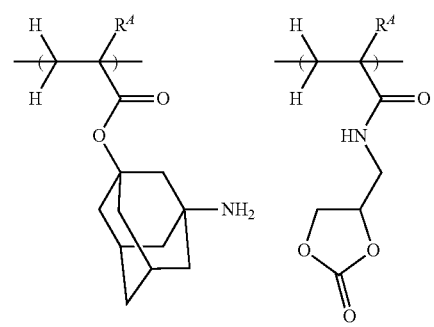
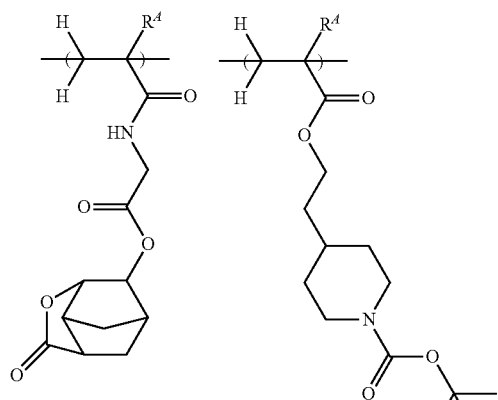
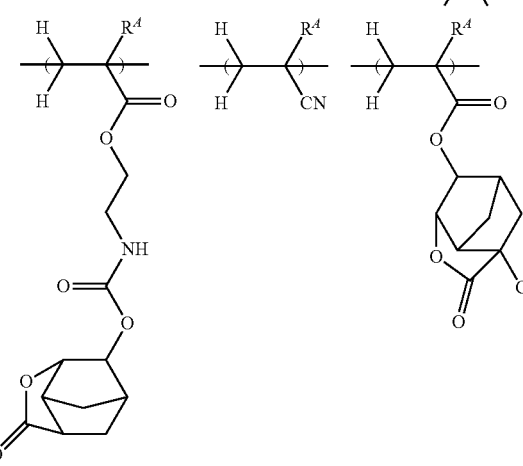
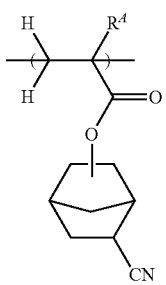
Examples of the recurring unit (a5) are given below, but not limited thereto. Herein $R^A$ is as defined above.
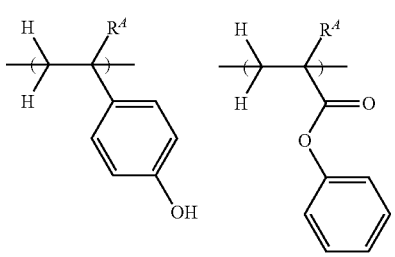
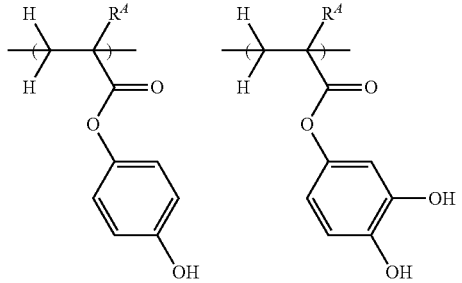
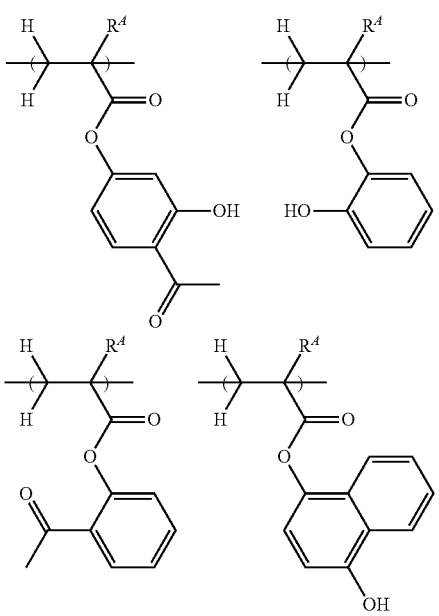

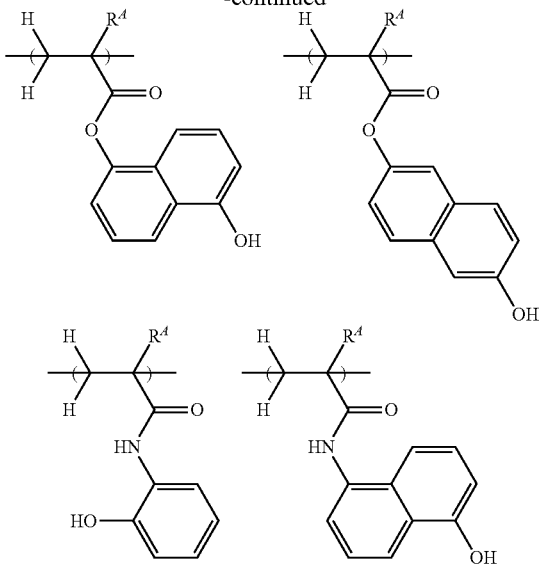

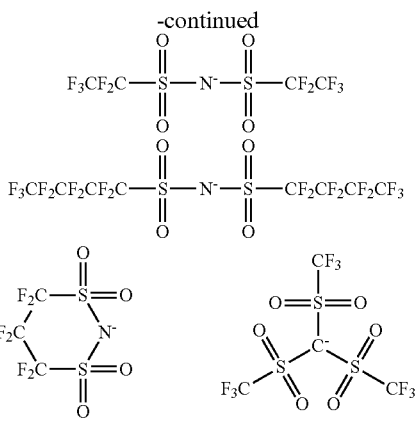

The compositional ratio (in molar ratio) of recurring units in Polymer A is, provided that r is a molar ratio of recurring units (a1), s is a molar ratio of recurring units (a2), t is a molar ratio of recurring units (a3), and u is a molar ratio of other recurring units, preferably in the range: $0.2 \le r \le 0.8$, $0.2 \le s \le 0.8$, $0 \le t \le 0.3$, $0 \le u \le 0.3$, more preferably in the range: $0.3 \le r \le 0.7$, $0.3 \le s \le 0.7$, $0 \le t \le 0.2$, $0 \le u \le 0.2$, from the standpoints of solvent resistance and ease of removal. Notably $r+s+t+u=1$.

Polymer A preferably has a weight average molecular weight (Mw) of 1,000 to 500,000, and more preferably 2,000 to 30,000, as measured versus polystyrene standards by gel permeation chromatography (GPC) using tetrahydrofuran (THF) as solvent. Polymer A should preferably have a narrow dispersity (Mw/Mn) of 1.0 to 2.2, more preferably 1.0 to 1.8.

Polymer A may be a mixture of two or more polymers which are different in compositional ratio, Mw and/or Mw/Mn.

(B) Thermal Acid Generator

Component (B) is a thermal acid generator which is a compound capable of generating an acid upon heating. The thermal acid generator (B) is not particularly limited as long as it is a compound which is stable at room temperature and capable of generating, upon heating, an acid necessary for deprotection reaction of acid labile groups on the polymer as component (A). Typical of the thermal acid generator are ammonium salts of primary to quaternary ammonium cations with strong acid anions such as fluoroalkanesulfonate, fluorobenzenesulfonate, sulfonimide and methide ions, as shown below.

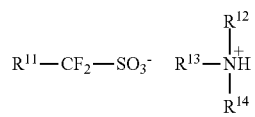

Also, ammonium salts of the structure having the following formula (B1) are preferred as the thermal acid generator (B) because the generated acid has a high acidity, controllable volatility, and controllable solvent solubility, and the substrate protective film-forming composition has long-term stability.

$$R^{11}-CF_2-SO_3^- \quad R^{13}-\overset{\overset{R^{12}}{|}}{\underset{\underset{R^{14}}{|}}{N^+H}} \quad (B1)$$

In formula (B1), $R^{11}$ is fluorine or a $C_1$-$C_{50}$ monovalent hydrocarbon group which may contain a heteroatom and in which some or all hydrogen atoms may be substituted by fluorine.

In formula (B1), $R^{12}$, $R^{13}$ and $R^{14}$ are each independently a $C_1$-$C_{10}$ straight or branched alkyl group which may contain a heteroatom, $C_2$-$C_{10}$ straight or branched alkenyl group, $C_6$-$C_{18}$ aryl group, or $C_7$-$C_{20}$ aralkyl group, in which some or all hydrogen atoms may be substituted by a moiety containing a heteroatom such as oxygen, sulfur, nitrogen or halogen, or in which some carbon may be replaced by a moiety containing a heteroatom such as oxygen, sulfur or nitrogen, so that the group may contain a hydroxyl, cyano, carbonyl, ether bond, ester bond, sulfonate ester bond, carbonate bond, lactone ring, sultone ring, carboxylic anhydride, or haloalkyl.

Any two or more of $R^{12}$, $R^{13}$ and $R^{14}$ may bond together to form a ring with the nitrogen atom to which they are attached.

Suitable alkyl groups include methyl, ethyl, propyl, isopropyl, n-butyl, sec-butyl, tert-butyl, n-pentyl, tert-pentyl, n-hexyl, n-octyl, n-nonyl, n-decyl, and 2-ethylhexyl. Suitable alkenyl groups include vinyl, 1-propenyl, 2-propenyl, butenyl, and hexenyl. Suitable aryl groups include phenyl, tolyl, xylyl, 1-naphthyl, and 2-naphthyl. Suitable aralkyl groups include benzyl, 1-phenylethyl and 2-phenylethyl.

Examples of the anion in the compound having formula (B1) are shown below, but not limited thereto.

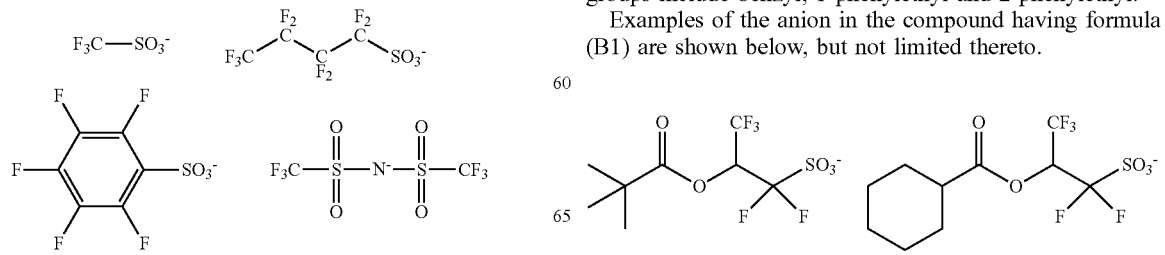

-continued
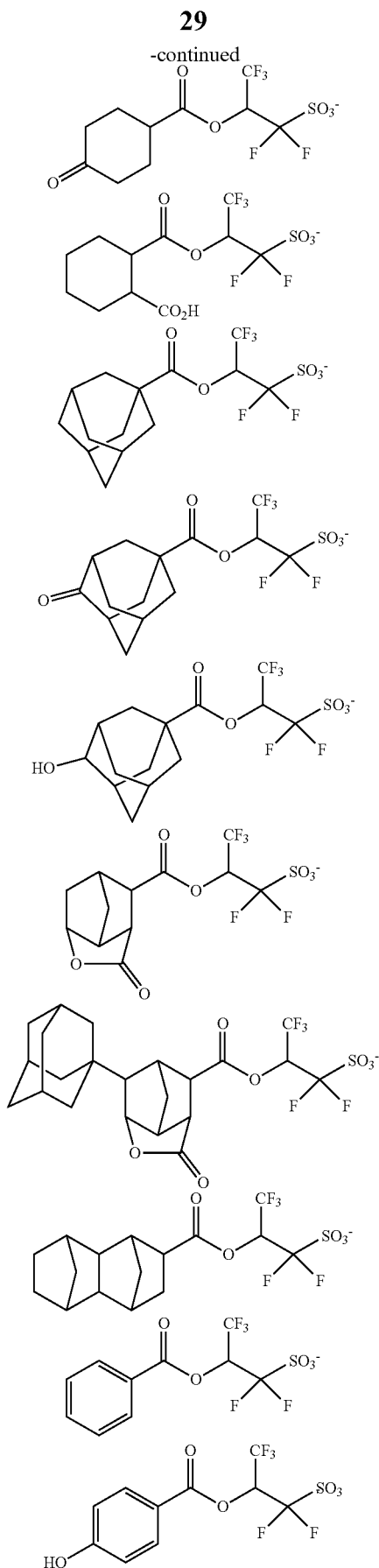
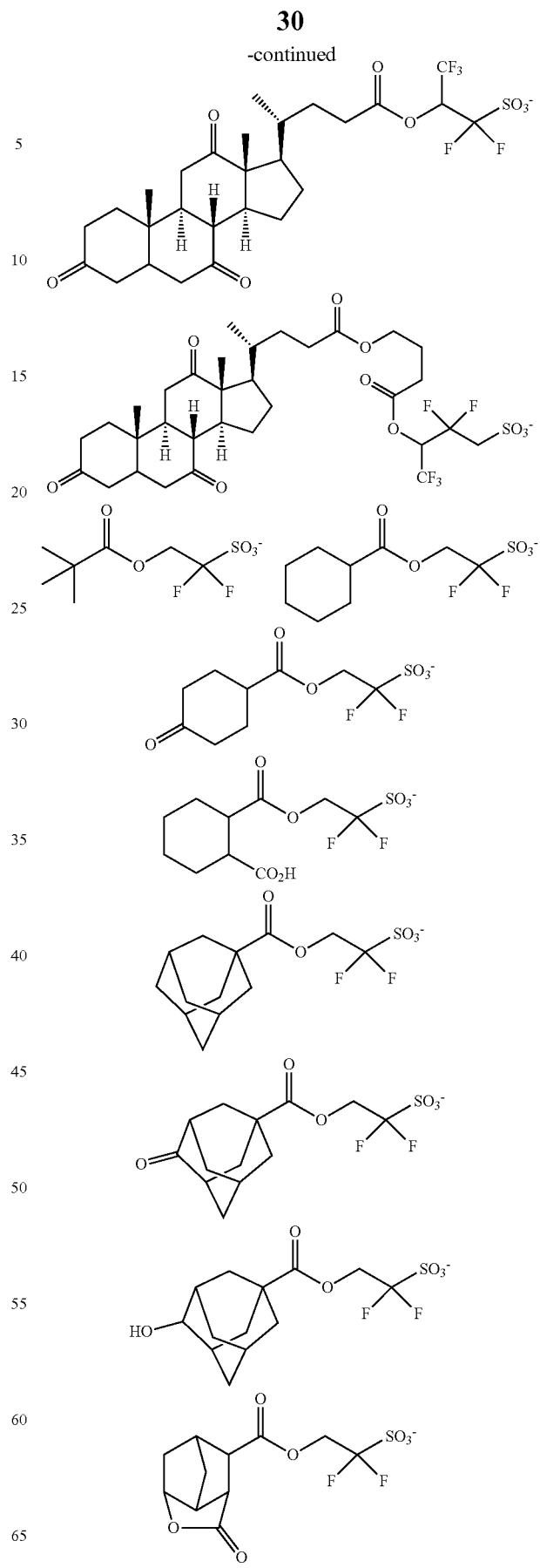

-continued

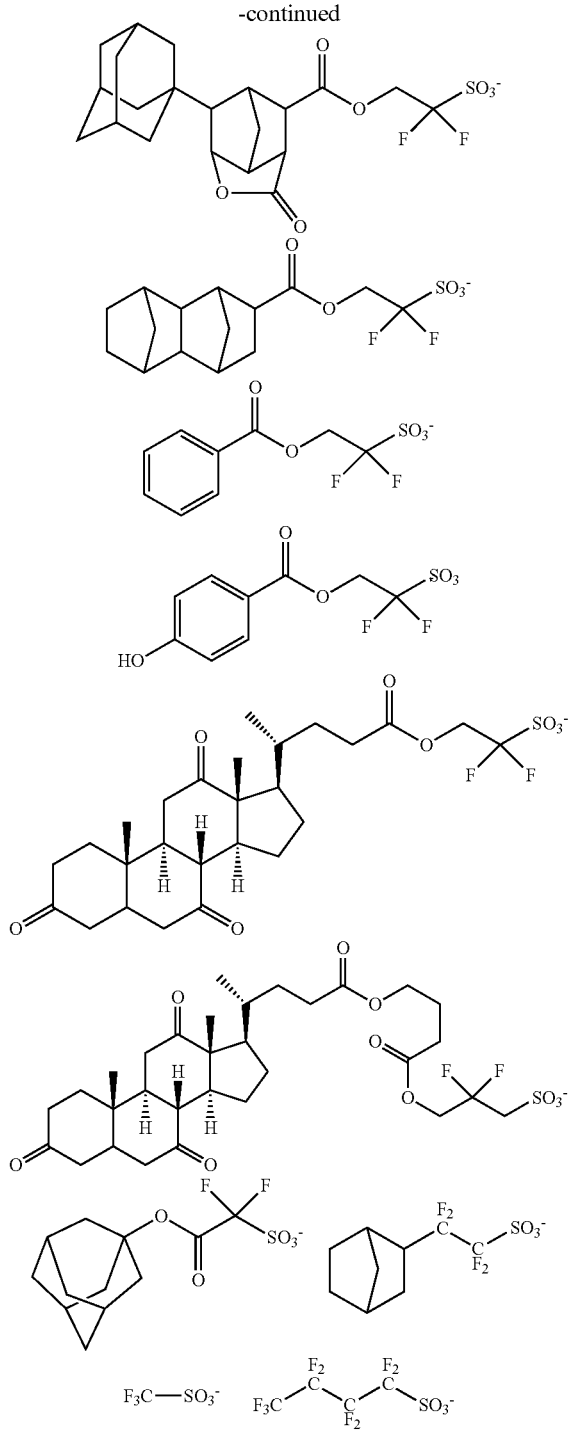

Examples of the cation in the compound having formula (B1) are shown below, but not limited thereto.

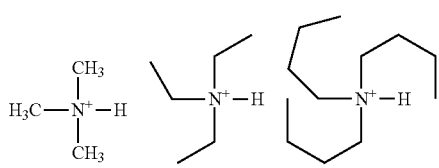

-continued

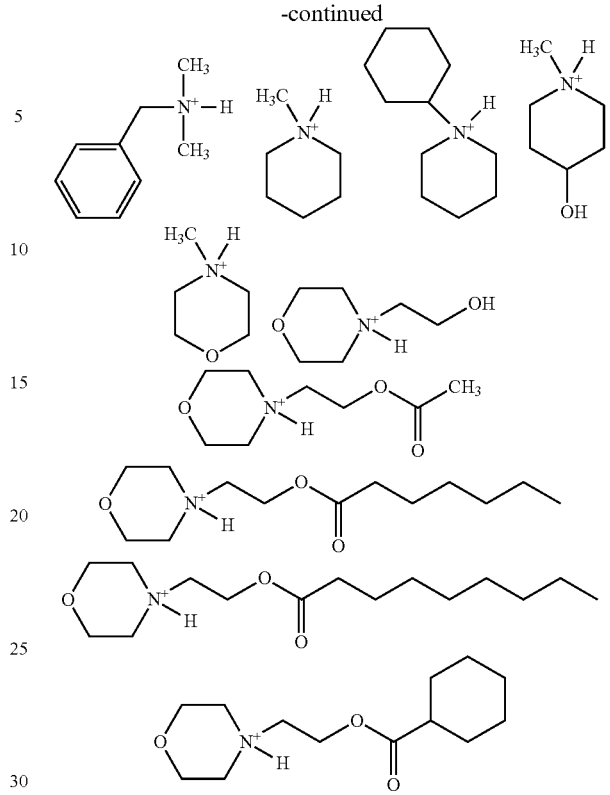

An appropriate amount of thermal acid generator (B) used is 0.5 to 20 parts by weight, more preferably 1 to 10 parts by weight per 100 parts by weight of the polymer as component (A). The thermal acid generator (B) may be used alone or in admixture.

(C) Organic Solvent

Any organic solvent may be used as long as the foregoing components and other additives are soluble therein. Suitable organic solvents include ketones such as cyclohexanone and methyl-2-n-pentyl ketone; alcohols such as 3-methoxybutanol, 3-methyl-3-methoxybutanol, 1-methoxy-2-propanol, and 1-ethoxy-2-propanol; ethers such as propylene glycol monomethyl ether (PGME), ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone, and mixtures thereof.

In view of solvent solubility control, an appropriate amount of the organic solvent used is 100 to 10,000 parts, more preferably 300 to 8,000 parts by weight per 100 parts by weight of the polymer as component (A).

Other Components

If necessary, the substrate protective film-forming composition may comprise a basic compound, surfactant or other additives for the purposes of improving storage stability, coating efficiency or the like.

Suitable basic compounds include primary, secondary and tertiary amine compounds, specifically amine compounds having a hydroxyl group, ether bond, ester bond, lactone ring, cyano group or sulfonate group, as described in JP-A 2008-111103, paragraphs [0146]-[0164] (U.S. Pat. No. 7,537,880), and compounds having a carbamate group, as described in JP 3790649.

Suitable surfactants include fluorochemical surfactants FC-4430 (3M), Olfine® E1004 (Nissin Chemical Co., Ltd.), Surflon® S-381, KH-20 and KH-30 (AGC Seimi Chemical Co., Ltd.). Partially fluorinated oxetane ring-opened polymers having the formula (surf-1) are also useful.

(surf-1)

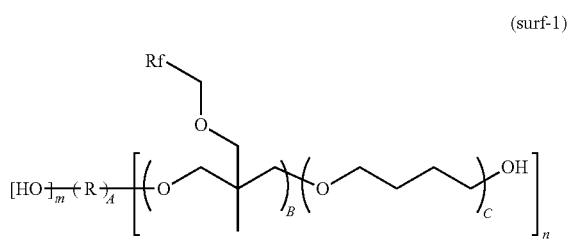

It is provided herein that R, Rf, A, B, C, m, and n are applied to only formula (surf-1), independent of their descriptions other than for the surfactant. R is a di- to tetra-valent $C_2$-$C_5$ aliphatic group. Exemplary divalent aliphatic groups include ethylene, 1,4-butylene, 1,2-propylene, 2,2-dimethyl-1,3-propylene and 1,5-pentylene. Exemplary tri- and tetra-valent groups are shown below.

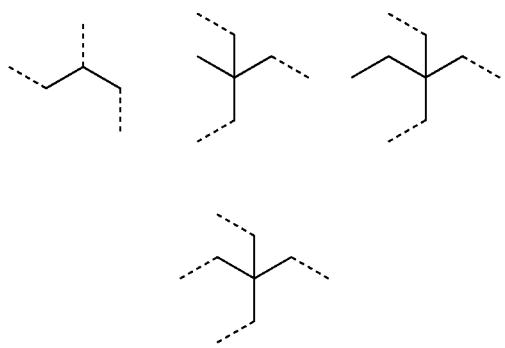

Herein the broken line denotes a valence bond. These formulae are partial structures derived from glycerol, trimethylol ethane, trimethylol propane, and pentaerythritol, respectively. Of these, 1,4-butylene and 2,2-dimethyl-1,3-propylene are preferably used.

Rf is trifluoromethyl or pentafluoroethyl, and preferably trifluoromethyl. The letter m is an integer of 0 to 3, n is an integer of 1 to 4, and the sum of m and n, which represents the valence of R, is an integer of 2 to 4. "A" is equal to 1, B is an integer of 2 to 25, and C is an integer of 0 to 10. Preferably, B is an integer of 4 to 20, and C is 0 or 1. Note that the formula (surf-1) does not prescribe the arrangement of respective constituent units while they may be arranged either blockwise or randomly. For the preparation of surfactants in the form of partially fluorinated oxetane ring-opened polymers, reference should be made to U.S. Pat. No. 5,650,483, for example.

The amount of the basic compound or surfactant blended may be selected for a particular purpose while they may be used alone or in admixture.

Pattern Forming Process

A further embodiment of the invention is a pattern forming process comprising the steps of:

(i) applying the substrate protective film-forming composition defined above to a substrate to form a protective film thereon, (ii) applying a resist material on the protective film to form a resist film thereon, (iii) exposing the resist film to high-energy radiation, (iv) developing the exposed resist film in a developer to form a resist pattern, and (v) dissolving away the protective film in entirety or in a selected portion using an organic solvent or basic aqueous solution.

Step (i) is to form a protective film on a substrate using the substrate protective film-forming composition defined above. The type of the substrate is not particularly limited. Suitable substrates include silicon wafers, and silicon wafers having an amorphous silicon film, silicon oxide film, silicon nitride film, or amorphous carbon film deposited on their surface by chemical vapor deposition or the like, or a film formed on their surface by coating and baking a solution of a silicon-containing material or high carbon content material. These substrates may be processed by etching treatment through the resist pattern as a mask.

The substrate protective film may be formed by coating the substrate protective film-forming composition onto a substrate and heat treating the coating. As viewed from the aspect of controlling the removal rate of the substrate protective film-forming composition for thereby adjusting the solvent resistance in the subsequent step of coating a resist material and the ease of removal of the substrate protective film-forming composition in the final step, the heating temperature is preferably at least 120° C., more preferably at least 140° C. Although the upper limit of the heating temperature is not critical, the temperature is usually up to 200° C. The heating time is preferably 15 to 300 seconds, more preferably 30 to 120 seconds.

The substrate protective film-forming composition may be coated to any portion of the substrate, for example, the entire surface of a wafer, or a selected portion such as an outer peripheral portion or back surface of a wafer. Also, the coating technique is not critical.

Step (ii) is to form a resist film on the substrate protective film using a resist material. Preferably from the aspects of sensitivity and etching resistance, the resist film comprises at least 2% by weight of silicon, or one or more elements selected from the metals of the 4th, 5th and 6th periods in Periodic table. Of these metals, titanium, cobalt, zirconium, silver, tin, barium, cerium, hafnium, and platinum are preferred because salt compounds and complex compounds thereof are widely applicable.

Examples of the resist material capable of forming a resist film containing silicon, or one or more elements selected from the metals of the 4th, 5th and 6th periods in Periodic table include the compositions described in Patent Documents 1 to 4 and Non-Patent Document 1, and the compositions described in JP 6119544, Proc. SPIE Vol. 8322, 83220U (2012), Proc. SPIE Vol. 9048, 904805 (2014), and Proc. SPIE Vol. 9051, 90511B (2014).

The resist film may be formed by coating the resist material onto the substrate protective film and heat treating the coating. The heating temperature is preferably 70 to 150° C., more preferably 90 to 130° C. The heating time is preferably 15 to 300 seconds, more preferably 30 to 120 seconds.

Step (iii) is to expose the resist film to high-energy radiation. Typical of the high-energy radiation are EB, EUV of wavelength 13.5 nm, ArF excimer laser of wavelength 193 nm, and KrF excimer laser of wavelength 248 nm. In the embodiment wherein the resist material contains a metal, EUV is preferred from which it is expectable to take the advantage of high sensitivity to a maximum extent.

Step (iv) is to develop the exposed resist film in a developer to form a resist pattern. While the developer used herein is not particularly limited, an appropriate developer for a particular resist material used may be selected. In order to derive the protecting ability of the substrate protective film-forming composition to a maximum extent, the developer used herein should preferably contain at least one organic solvent selected from the group consisting of 2-octanone, 2-nonanone, 2-heptanone, 3-heptanone, 4-heptanone, 2-hexanone, 3-hexanone, diisobutyl ketone, 2-methylcyclohexanone, 3-methylcyclohexanone, 4-methylcyclohexanone, acetophenone, 2'-methylacetophenone, 4'-methylacetophenone, butyl acetate, isobutyl acetate, pentyl acetate, isopentyl acetate, phenyl acetate, methyl valerate, methyl 2-hydroxyisobutyrate, ethyl 2-hydroxyisobutyrate, methyl benzoate, ethyl benzoate, benzyl acetate, methyl phenylacetate, and methyl 3-phenylpropionate. The content of the organic solvent(s) in the developer is preferably at least 60% by weight.

The step (iv) of development to form a resist pattern is followed by step (v) of dissolving away the protective film in entirety or in an unnecessary portion using an organic solvent or basic aqueous solution.

Examples of the organic solvent used herein include the organic solvents serving as component (C) in the substrate protective film-forming composition, preferably propylene glycol monomethyl ether (PGME), propylene glycol monomethyl ether acetate (PGMEA), or a mixture thereof, because of high solubility. As the basic aqueous solution, a commonly used aqueous solution of tetramethylammonium hydroxide (TMAH) is preferred because of high solubility. The preferred aqueous solution has a concentration of 1 to 4% by weight of TMAH.

EXAMPLES

Synthesis Examples, Examples and Comparative Examples are given below by way of illustration and not by way of limitation. The abbreviation "pbw" is parts by weight. For all polymers, Mw and Mn are determined by GPC versus polystyrene standards using THF solvent.

[1] Synthesis of Polymers

Synthesis Example 1

Synthesis of Polymer for Substrate Protective Film-Forming Composition

Polymers were prepared by combining suitable monomers, effecting copolymerization reaction thereof in tetrahydrofuran (THF) solvent, pouring the reaction solution into methanol for crystallization, repeatedly washing with hexane, isolation, and drying. The resulting polymers, designated Polymers 1 to 17, were analyzed for composition by $^1$H-NMR spectroscopy, and for Mw and Mw/Mn by GPC versus polystyrene standards using THF solvent.

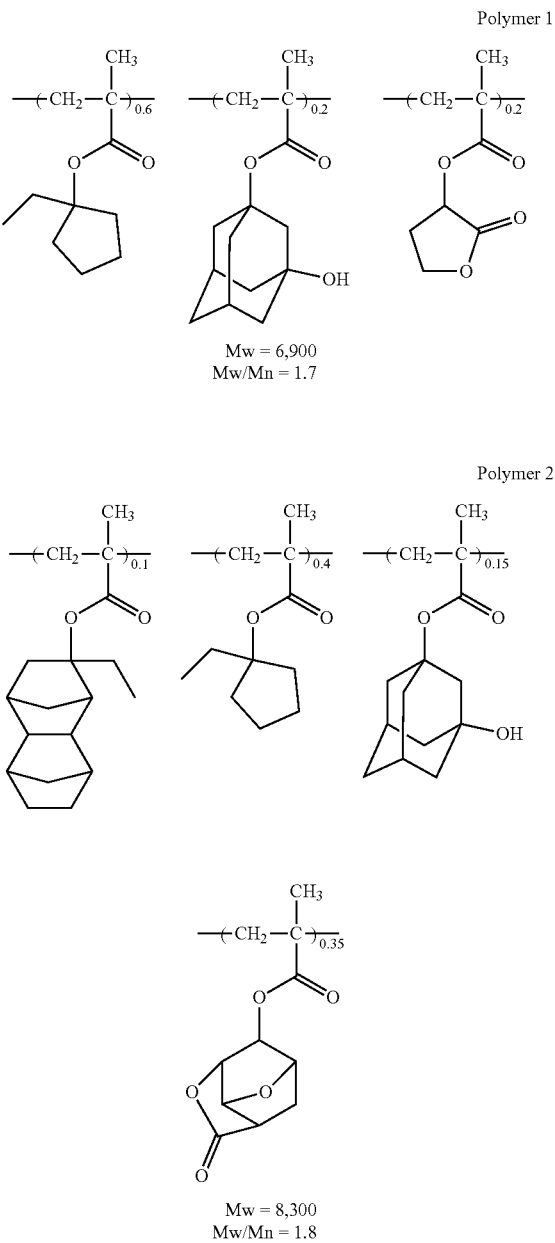

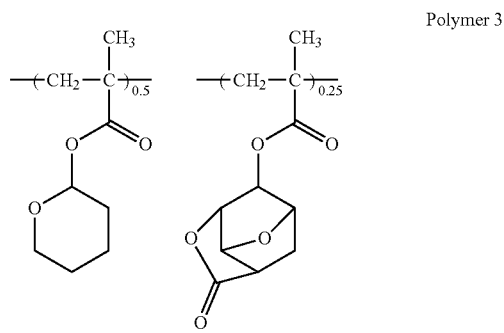

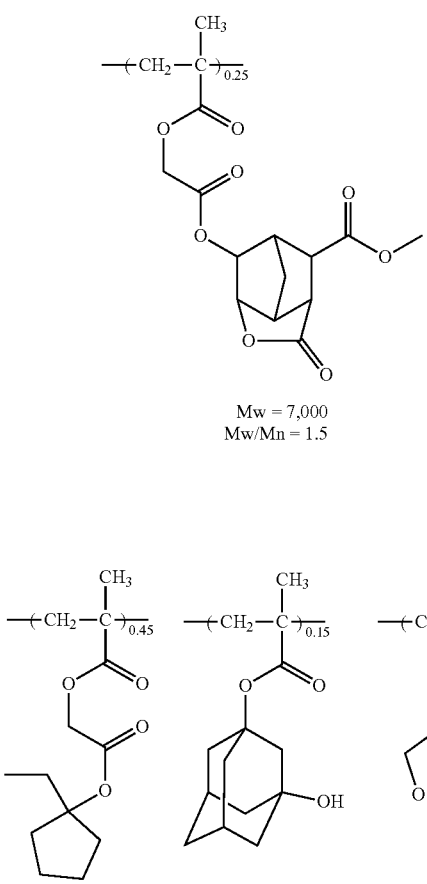
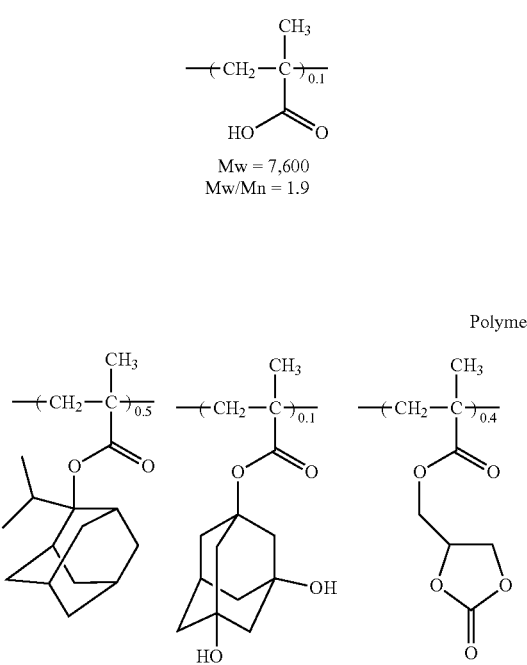
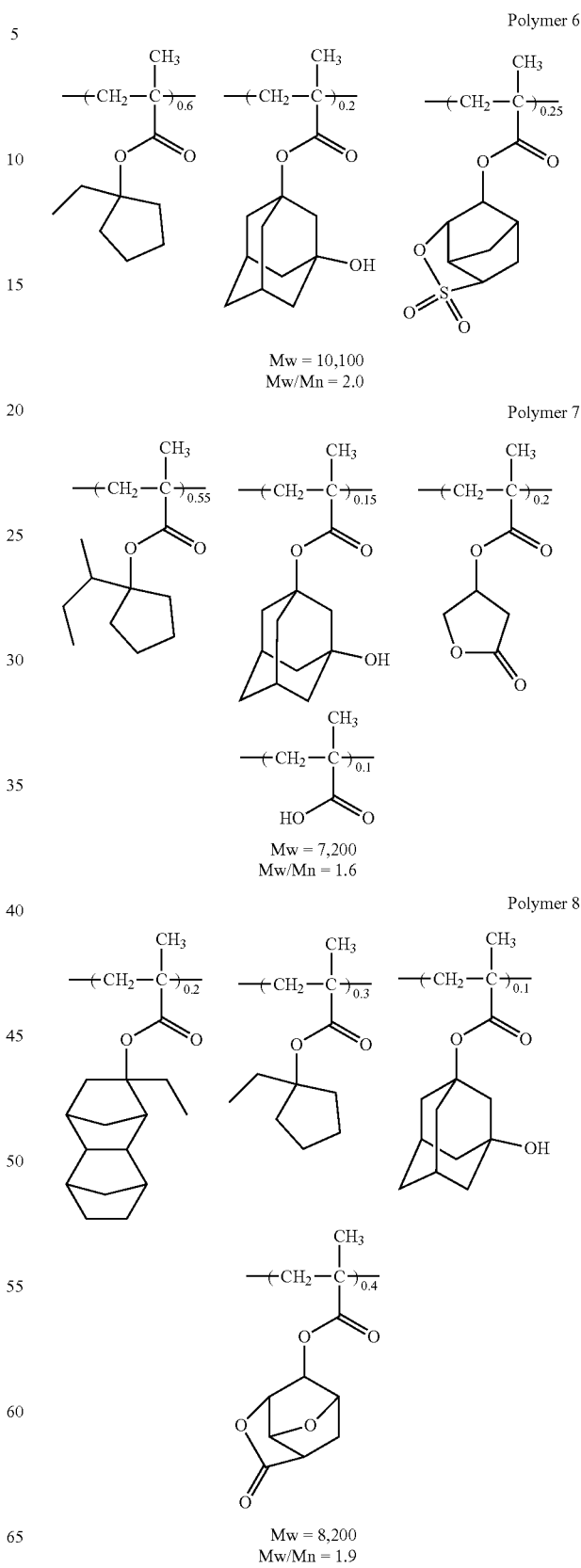

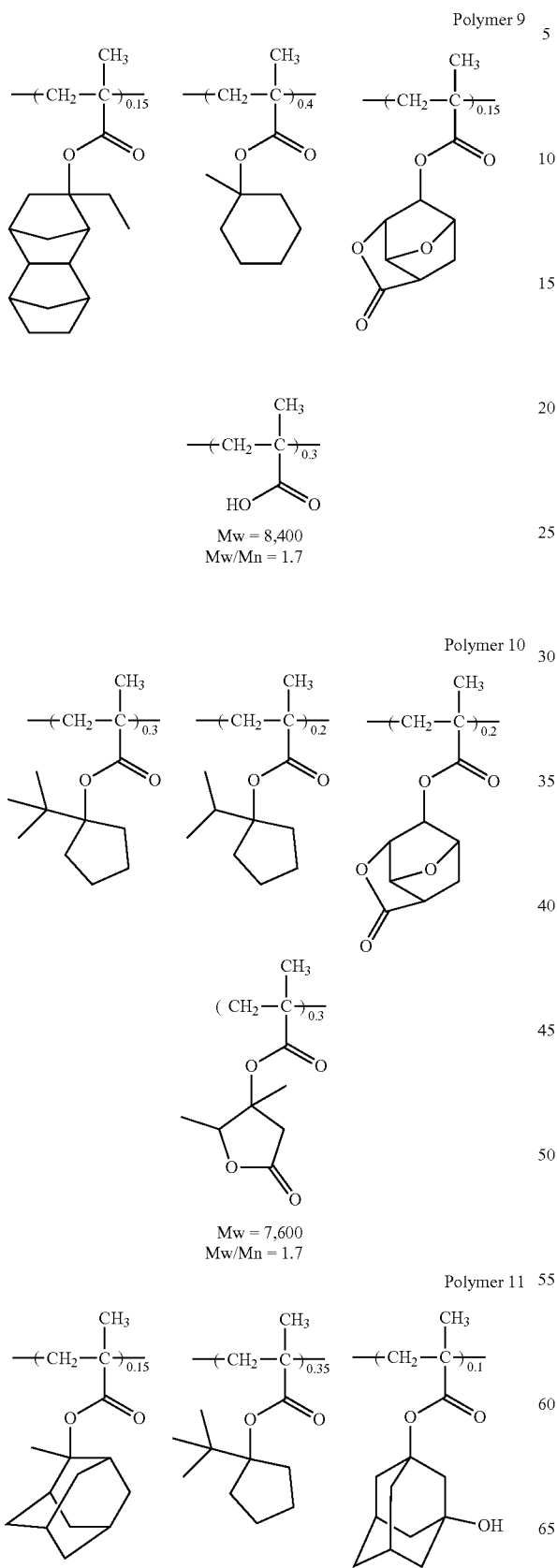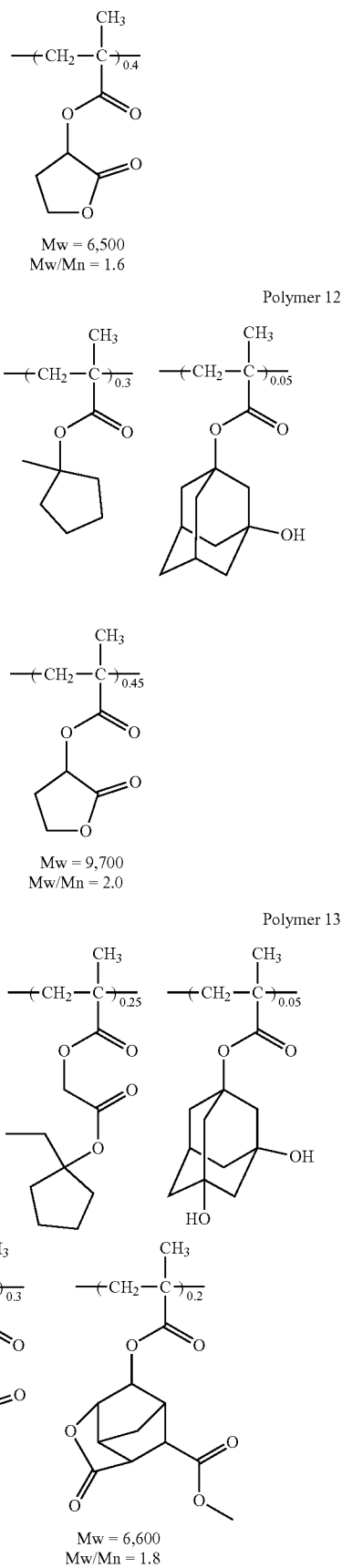

Polymer 14

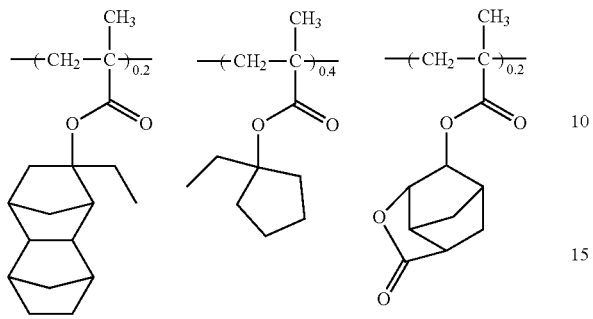

Polymer 17

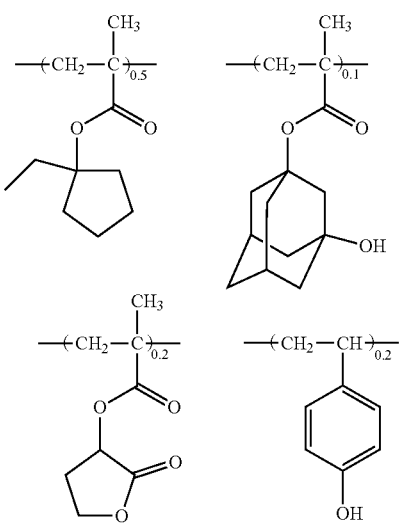

Mw = 6,300
Mw/Mn = 1.6

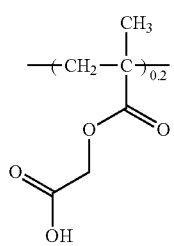

Mw = 5,900
Mw/Mn = 1.5

Synthesis Example 2

Synthesis of Polymer for Resist Material

Base polymers were prepared by combining suitable monomers, effecting copolymerization reaction thereof in THF solvent, pouring the reaction solution into methanol for crystallization, repeatedly washing with hexane, isolation, and drying. The resulting base polymers, designated PRP-1 and PRP-2, were analyzed for composition by $^1$H-NMR spectroscopy, and for Mw and Mw/Mn by GPC versus polystyrene standards using THF solvent.

Polymer 15

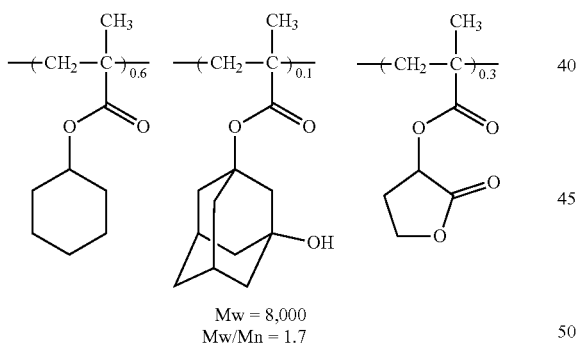

Mw = 8,000
Mw/Mn = 1.7

Polymer 16

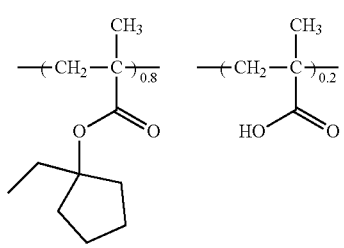

Mw = 10,000
Mw/Mn = 1.8

PRP-1

Mw = 6,900
Mw/Mn = 1.7

PRP-2

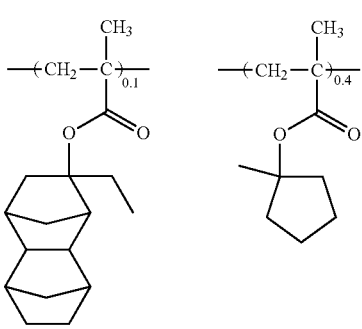

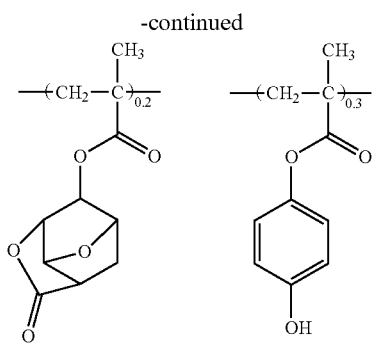

Mw = 8,300
Mw/Mn = 1.8

[2] Preparation of Substrate Protective Film-Forming Composition

Examples 1-1 to 1-16 and Comparative Examples 1-1 to 1-4

Substrate protective film-forming compositions, designated PL-1 to PL-20, were prepared by dissolving components in a solvent in accordance with the formulation shown in Table 1, and filtering through a Teflon® filter with a pore size of 0.2 μm.

TABLE 1

|  |  | Substrate protective film-forming composition | Polymer (pbw) | Thermal acid generator (pbw) | Basic compound (pbw) | Surfactant (pbw) | Solvent (pbw) |
| --- | --- | --- | --- | --- | --- | --- | --- |
| Example | 1-1 | PL-1 | Polymer 1 (95) | TAG-1 (5.0) |  | SF-1 (0.1) | PGMEA (1,400) CyHO (700) |
|  | 1-2 | PL-2 | Polymer 2 (95) | TAG-2 (5.0) |  | SF-1 (0.1) | PGMEA (1,400) CyHO (700) |
|  | 1-3 | PL-3 | Polymer 2 (95) | TAG-2 (5.0) | Base-1 (0.2) | SF-1 (0.1) | PGMEA (1,400) CyHO (700) |
|  | 1-4 | PL-4 | Polymer 2 (95) | TAG-2 (5.0) | Base-2 (0.2) | SF-1 (0.1) | PGMEA (1,400) CyHO (700) |
|  | 1-5 | PL-5 | Polymer 3 (95) | TAG-2 (5.0) |  | SF-1 (0.1) | PGMEA (1,400) CyHO (700) |
|  | 1-6 | PL-6 | Polymer 4 (95) | TAG-2 (5.0) |  | SF-1 (0.1) | PGMEA (1,400) CyHO (700) |
|  | 1-7 | PL-7 | Polymer 5 (95) | TAG-2 (5.0) |  | SF-1 (0.1) | PGMEA (1,400) CyHO (700) |
|  | 1-8 | PL-8 | Polymer 6 (95) | TAG-3 (5.0) |  | SF-1 (0.1) | PGMEA (1,400) CyHO (700) |
|  | 1-9 | PL-9 | Polymer 7 (95) | TAG-3 (5.0) |  | SF-1 (0.1) | PGMEA (1,400) CyHO (700) |
|  | 1-10 | PL-10 | Polymer 8 (95) | TAG-3 (5.0) |  | SF-1 (0.1) | PGMEA (1,400) CyHO (700) |
|  | 1-11 | PL-11 | Polymer 9 (95) | TAG-3 (5.0) |  | SF-1 (0.1) | PGMEA (1,400) CyHO (700) |
|  | 1-12 | PL-12 | Polymer 10 (95) | TAG-3 (5.0) |  | SF-1 (0.1) | PGMEA (1,400) CyHO (700) |
|  | 1-13 | PL-13 | Polymer 11 (95) | TAG-4 (5.0) |  | SF-1 (0.1) | PGMEA (1,400) CyHO (700) |
|  | 1-14 | PL-14 | Polymer 12 (95) | TAG-4 (5.0) |  | SF-1 (0.1) | PGMEA (1,400) CyHO (700) |
|  | 1-15 | PL-15 | Polymer 13 (92) | TAG-5 (8.0) |  | SF-1 (0.1) | PGMEA (1,400) CyHO (700) |
|  | 1-16 | PL-16 | Polymer 14 (92) | TAG-5 (8.0) |  | SF-1 (0.1) | PGMEA (1,400) CyHO (700) |
| Comparative Example | 1-1 | PL-17 | Polymer 1 (95) |  |  | SF-1 (0.1) | PGMEA (1,400) CyHO (700) |
|  | 1-2 | PL-18 | Polymer 15 (95) | TAG-2 (5.0) |  | SF-1 (0.1) | PGMEA (1,400) CyHO (700) |
|  | 1-3 | PL-19 | Polymer 16 (95) | TAG-2 (5.0) |  | SF-1 (0.1) | PGMEA (1,400) CyHO (700) |
|  | 1-4 | PL-20 | Polymer 17 (95) | PAG-3 (5.0) |  | SF-1 (0.1) | PGMEA (1,400) GBL (700) |

In Table 1, Polymers 1 to 17 are as defined above. The solvents, thermal acid generators TAG-1 to TAG-5, basic compounds Base-1 and Base-2, and surfactant SF-1 are identified below.

Solvents
  PGMEA: propylene glycol monomethyl ether acetate
  CyHO: cyclohexanone
  GBL: γ-butyrolactone Thermal acid generators TAG-1 to TAG-5

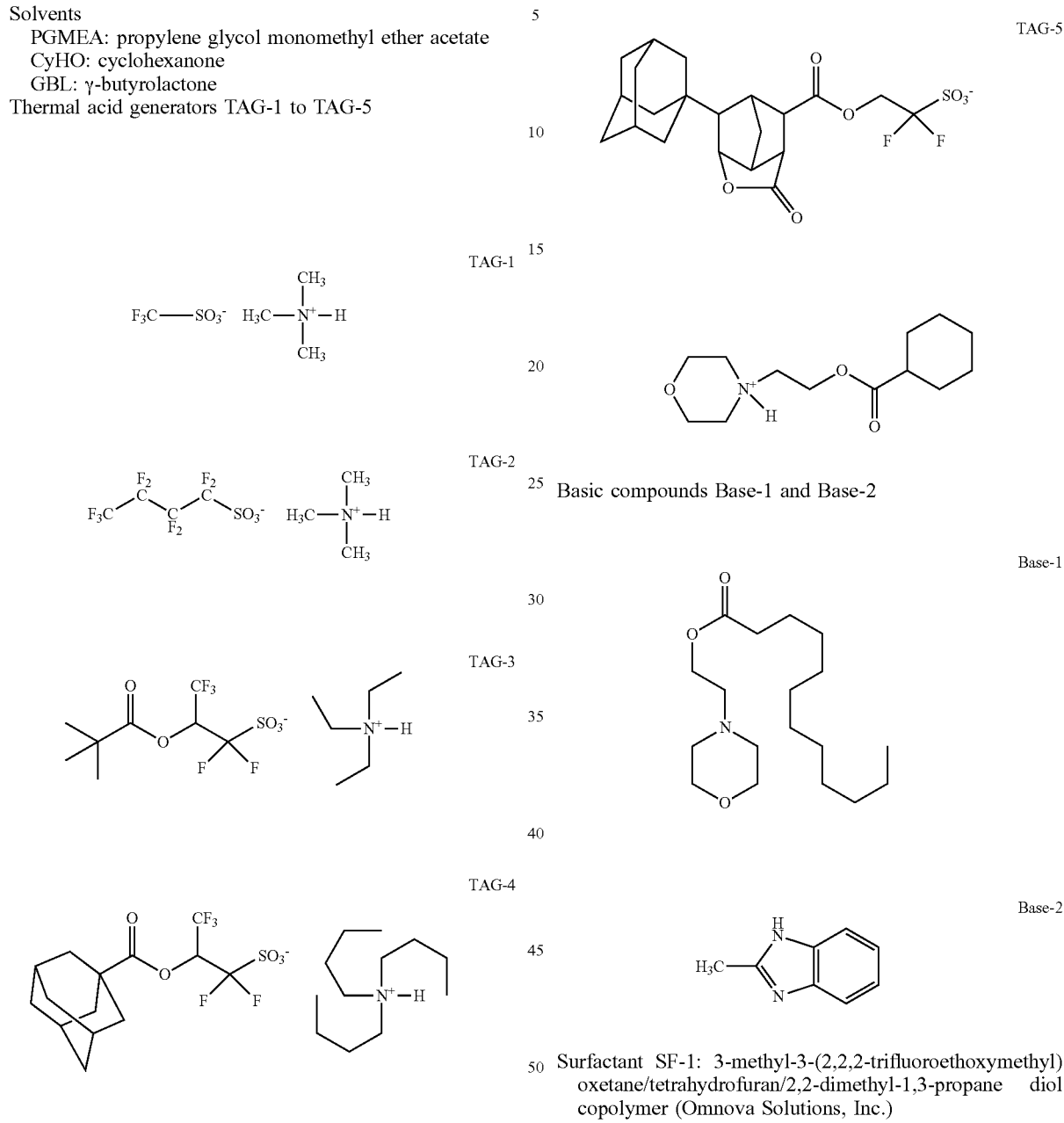

Basic compounds Base-1 and Base-2

Surfactant SF-1: 3-methyl-3-(2,2,2-trifluoroethoxymethyl) oxetane/tetrahydrofuran/2,2-dimethyl-1,3-propane diol copolymer (Omnova Solutions, Inc.)

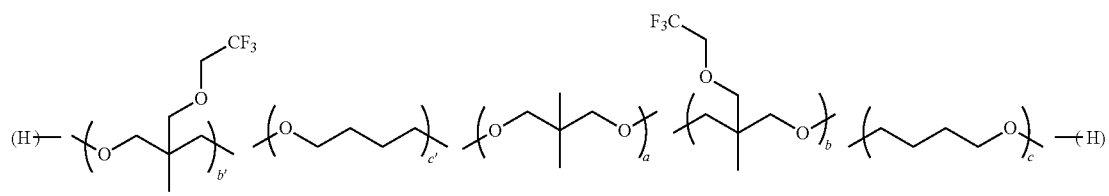

a:(b + b'):(c + c') = 1:4-7:0.01-1 (molar ratio)

Mw = 1,500

[3] Preparation of Resist Material

Resist materials (R-1 and R-2) in solution form were prepared by dissolving components in a solvent in accordance with the formulation shown in Table 2, and filtering through a Teflon® filter with a pore size of 0.2 μm.

TABLE 2

| Resist material | Base polymer (pbw) | Photoacid generator (pbw) | Quencher (pbw) | Metal-containing additive (pbw) | Surfactant (pbw) | Solvent (pbw) |
|---|---|---|---|---|---|---|
| R-1 | PRP-1 (85) | PAG-1 (15.0) | Q-1 (0.3) | MA-1 (0.3) | SF-1 (0.1) | PGMEA (2,800) CyHO (1,400) |
| R-2 | PRP-2 (85) | PAG-1 (15.0) | Q-1 (0.3) | MA-2 (0.3) | SF-1 (0.1) | PGMEA (2,800) CyHO (1,400) |

In Table 2, base polymers PRP-1, PRP-2, surfactant SF-1, and solvents are as defined above. The photoacid generator PAG-1, quencher Q-1, and metal-containing additives MA-1, MA-2 are identified below.

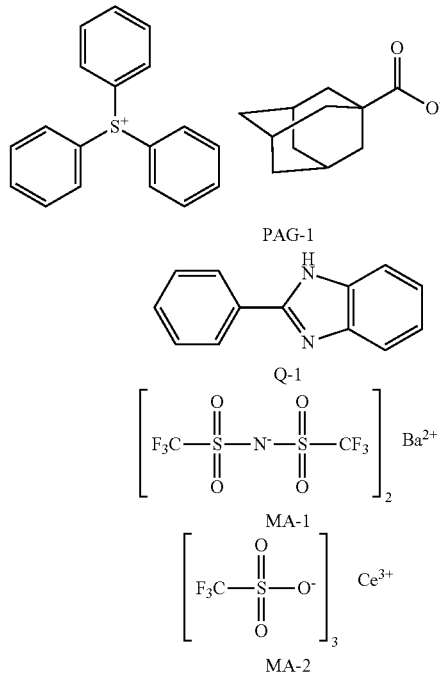

PAG-1

Q-1

MA-1

MA-2

[4] Evaluation 1 of Substrate Protective Film-Forming Composition: Solvent Resistance Test Each of substrate protective film-forming compositions PL-1 to PL-20 was spin coated onto a silicon wafer and baked on a hotplate at the temperature shown in Table 3 for 60 seconds, to form a protective film of 300 nm thick.

While the wafer was rotated, each test solvent (shown below) which can be used as the resist solvent or developer was applied dropwise onto the protective film for 30 seconds. Thereafter the thickness of the protective film was measured, from which a loss of film thickness due to dissolution was calculated. In terms of solvent resistance, the film was rated NG for a film thickness loss of 10 nm or more and Good for a film thickness loss of less than 10 nm. The results are shown in Table 3.

Test Solvents:
PGMEA/CyHO: 7/3 (weight ratio) mixture of PGMEA and CyHO
BA: butyl acetate
HPO: 2-heptanone

TABLE 3

| | | Substrate protective film-forming composition | Bake temperature (° C.) | Solvent resistance test | |
|---|---|---|---|---|---|
| | | | | Test solvent | Result |
| Example | 2-1 | PL-1 | 160 | PGMEA/CyHO | Good |
| | 2-2 | PL-1 | 160 | BA | Good |
| | 2-3 | PL-2 | 160 | PGMEA/CyHO | Good |
| | 2-4 | PL-2 | 160 | BA | Good |
| | 2-5 | PL-2 | 160 | HPO | Good |
| | 2-6 | PL-3 | 160 | PGMEA/CyHO | Good |
| | 2-7 | PL-4 | 160 | PGMEA/CyHO | Good |
| | 2-8 | PL-4 | 160 | BA | Good |
| | 2-9 | PL-5 | 140 | PGMEA/CyHO | Good |
| | 2-10 | PL-6 | 140 | PGMEA/CyHO | Good |
| | 2-11 | PL-7 | 150 | PGMEA/CyHO | Good |
| | 2-12 | PL-8 | 160 | PGMEA/CyHO | Good |
| | 2-13 | PL-9 | 140 | PGMEA/CyHO | Good |
| | 2-14 | PL-10 | 160 | PGMEA/CyHO | Good |
| | 2-15 | PL-11 | 160 | PGMEA/CyHO | Good |
| | 2-16 | PL-12 | 160 | PGMEA/CyHO | Good |
| | 2-17 | PL-13 | 170 | PGMEA/CyHO | Good |
| | 2-18 | PL-14 | 160 | PGMEA/CyHO | Good |
| | 2-19 | PL-15 | 150 | BA | Good |
| | 2-20 | PL-16 | 150 | BA | Good |
| Comparative Example | 2-1 | PL-17 | 160 | PGMEA/CyHO | NG |
| | 2-2 | PL-17 | 160 | BA | NG |
| | 2-3 | PL-17 | 160 | HPO | NG |
| | 2-4 | PL-18 | 160 | PGMEA/CyHO | NG |
| | 2-5 | PL-19 | 160 | PGMEA/CyHO | NG |
| | 2-6 | PL-20 | 160 | PGMEA/CyHO | Good |

[5] Evaluation 2 of Substrate Protective Film-Forming Composition: Removal Test Examples 3-1 to 3-20 and Comparative Examples 3-1 to 3-6

Each of substrate protective film-forming compositions PL-1 to PL-20 was spin coated onto a silicon wafer and baked on a hotplate at the temperature shown in Table 4 for 60 seconds, to form a protective film of 300 nm thick.

While the wafer was rotated, each fluid remover (shown below) was applied dropwise onto the protective film for 30 seconds. Thereafter the thickness of the protective film was measured, from which a loss of film thickness due to dissolution was calculated. In terms of film removal, the film was rated Good for a residual film thickness of less than 10 nm and NG for a residual film thickness of 10 nm or more. The results are shown in Table 4.

Test Fluid Removers:
TMAH: 2.38 wt % TMAH aqueous solution
PGMEA/PGME: 3/7 (weight ratio) mixture of PGMEA and PGME

TABLE 4

|  |  | Substrate protective film-forming composition | Bake temperature (° C.) | Removal test | |
|---|---|---|---|---|---|
|  |  |  |  | Fluid remover | Result |
| Example | 3-1 | PL-1 | 160 | TMAH | Good |
|  | 3-2 | PL-1 | 160 | PGMEA/PGME | Good |
|  | 3-3 | PL-2 | 160 | TMAH | Good |
|  | 3-4 | PL-2 | 160 | PGMEA/PGME | Good |
|  | 3-5 | PL-3 | 160 | PGMEA/PGME | Good |
|  | 3-6 | PL-4 | 160 | TMAH | Good |
|  | 3-7 | PL-4 | 160 | PGMEA/PGME | Good |
|  | 3-8 | PL-5 | 140 | PGMEA/PGME | Good |
|  | 3-9 | PL-6 | 140 | PGMEA/PGME | Good |
|  | 3-10 | PL-7 | 150 | PGMEA/PGME | Good |
|  | 3-11 | PL-8 | 160 | PGMEA/PGME | Good |
|  | 3-12 | PL-9 | 140 | TMAH | Good |
|  | 3-13 | PL-9 | 140 | PGMEA/PGME | Good |
|  | 3-14 | PL-10 | 160 | PGMEA/PGME | Good |
|  | 3-15 | PL-11 | 160 | PGMEA/PGME | Good |
|  | 3-16 | PL-12 | 160 | PGMEA/PGME | Good |
|  | 3-17 | PL-13 | 170 | PGMEA/PGME | Good |
|  | 3-18 | PL-14 | 160 | PGMEA/PGME | Good |
|  | 3-19 | PL-15 | 150 | PGMEA/PGME | Good |
|  | 3-20 | PL-16 | 150 | PGMEA/PGME | Good |
| Comparative Example | 3-1 | PL-17 | 160 | TMAH | NG |
|  | 3-2 | PL-17 | 160 | PGMEA/PGME | NG |
|  | 3-3 | PL-18 | 160 | PGMEA/PGME | NG |
|  | 3-4 | PL-19 | 160 | PGMEA/PGME | NG |
|  | 3-5 | PL-20 | 160 | TMAH | NG |
|  | 3-6 | PL-20 | 160 | PGMEA/PGME | NG |

As seen from the results in Tables 3 and 4, the substrate protective film-forming compositions within the scope of the invention meet both resistance to resist solvent or developer and ease of removal in the removal step.

[6] Evaluation 3 of Substrate Protective Film-Forming Composition: Substrate Metal Concentration Measurement Examples 4-1 to 4-4 and Comparative Examples 4-1 to 4-4

The substrate protective film-forming compositions PL-1 and PL-7 were tested. After the steps of forming a protective film on a substrate, forming a resist film thereon, developing or dissolving the resist film, and dissolving away the protective film, a metal concentration on the substrate was measured.

A spin-on carbon film solution ODL-50 (Shin-Etsu Chemical Co., Ltd.) was spin coated on a silicon wafer or substrate and baked on a hotplate at 300° C. for 60 seconds to form a spin-on carbon film of 200 nm thick. The substrate protective film-forming composition PL-1 or PL-7 was spin coated on the substrate and baked on a hotplate at the temperature shown in Table 5 for 60 seconds to form a protective film of 300 nm thick.

Further, resist material R-1 or R-2 was spin coated on the coated wafer and baked on a hotplate at 105° C. for 60 seconds to form a resist film of 60 nm thick. While the wafer was rotated, the developer 2-heptanone was added dropwise for 30 seconds to dissolve away the resist film.

Further, while the wafer was rotated, a 3/7 (weight ratio) mixture of PGMEA and PGME was added dropwise for 30 seconds to dissolve away the protective film.

Thereafter, the surface of the spin-on carbon film-bearing substrate was analyzed by X-ray photoelectron spectroscopy (XPS) to measure the concentration of barium (Ba) or cerium (Ce), which originated from the resist material. Using an XPS surface analyzer (K-Alpha by Thermo Fisher Scientific), peaks appearing at the bond energy positions of Ba-3d or Ce-3d on a photoelectron spectrum were observed. Similar analysis was made on carbon, oxygen, fluorine and nitrogen. By the relative sensitivity coefficient method, the concentration (atomic %) of each element was determined from the peak intensity area.

As a comparative experiment, resist material R-1 or R-2 was spin coated directly on the substrate, which had been coated with spin-on carbon film ODL-50, but not the protective film-forming composition, and baked on a hotplate at 105° C. for 60 seconds to form a resist film of 60 nm thick. While the wafer was rotated, a developer, butyl acetate (AcOBu) or 2-heptanone (2-HPO) was dispensed dropwise for 30 seconds to dissolve away the resist film. Thereafter, the surface element concentration was analyzed by XPS.

The deposition conditions of the spin-on carbon film and resist film and the XPS method are the same as above.

The results are shown in Table 5. Notably, a concentration below 0.1 atomic % is ND (not detected or below the detection limit).

TABLE 5

|  |  | Substrate protective film-forming composition | Bake temperature (° C.) | Resist material | Developer | Metal concentration (atomic %) | |
|---|---|---|---|---|---|---|---|
|  |  |  |  |  |  | Ba | Ce |
| Example | 4-1 | PL-1 | 160 | R-1 | 2-HPO | ND | ND |
|  | 4-2 | PL-1 | 160 | R-2 | 2-HPO | ND | ND |
|  | 4-3 | PL-7 | 150 | R-1 | 2-HPO | ND | ND |
|  | 4-4 | PL-7 | 150 | R-2 | 2-HPO | ND | ND |
| Comparative Example | 4-1 | none | — | R-1 | AcOBu | 0.9 | ND |
|  | 4-2 | none | — | R-2 | AcOBu | ND | 1.6 |
|  | 4-3 | none | — | R-1 | 2-HPO | 0.7 | ND |
|  | 4-4 | none | — | R-2 | 2-HPO | ND | 1.2 |

As seen from the results in Table 5, substrate protective film-forming compositions within the scope of the invention are effective for preventing the substrate from metal contamination in the pattern forming process using a metal-containing resist material.

Japanese Patent Application No. 2018-203522 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A pattern forming process comprising the steps of:
   (i) applying a substrate protective film-forming composition to a substrate to form a protective film thereon,
   (ii) applying a resist material on the protective film to form a resist film thereon,
   (iii) exposing the resist film to high-energy radiation,
   (iv) developing the exposed resist film in a developer, and
   (v) dissolving away the protective film in entirety or in a selected portion using an organic solvent or basic aqueous solution,
   wherein the substrate protective film-forming composition comprises:
   (A) a polymer consisting of recurring units (a1) having a carboxyl group protected with an acid labile group and recurring units (a2) having a structure selected from a cyclic ester, cyclic carbonate, and cyclic sulfonate, and optionally recurring units (a3) having a carboxyl group and recurring units (a4) having a polar group such as hydroxyl, amino, amide, carbamate or cyano, but not an aromatic ring and/or recurring units (a5) having an aromatic ring,
   (B) a thermal acid generator, and
   (C) an organic solvent,
   wherein the thermal acid generator is an ammonium salt of the structure having the following formula (B 1):

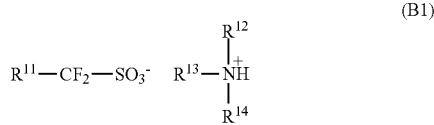

(B1)

wherein $R^{11}$ is fluorine or a $C_1$-$C_{50}$ monovalent hydrocarbon group which may contain a heteroatom and in which some or all hydrogen atoms may be substituted by fluorine, $R^{12}$, $R^{13}$ and $R^{14}$ are each independently a $C_1$-$C_{10}$ straight or branched alkyl group which may contain a heteroatom, $C_2$-$C_{10}$ straight or branched alkenyl group, $C_6$-$C_{18}$ aryl group, or $C_7$-$C_{20}$ aralkyl group, in which some or all hydrogen atoms may be substituted by a moiety containing a heteroatom such as oxygen, sulfur, nitrogen or halogen, or in which some carbon may be replaced by a moiety containing a heteroatom such as oxygen, sulfur or nitrogen, so that the group may contain a hydroxyl, cyano, carbonyl, ether bond, ester bond, sulfonate ester bond, carbonate bond, lactone ring, sultone ring, carboxylic anhydride, or haloalkyl, and any two or more of $R^{12}$, $R^{13}$ and $R^{14}$ may bond together to form a ring with the nitrogen atom to which they are attached, and wherein the resist film comprises at least 2% by weight of silicon, or one or more elements selected from the metals of the 4th, 5th and 6th periods in Periodic table.

2. The pattern forming process of claim 1 wherein the recurring units (a1) have the formula (a1):

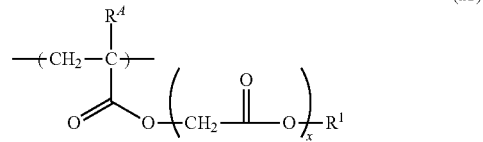

(a1)

wherein $R^A$ is hydrogen or methyl, $R^1$ is an acid labile group, and x is 0 or 1.

3. The pattern forming process of claim 1 wherein the recurring units (a2) have the formula (a2):

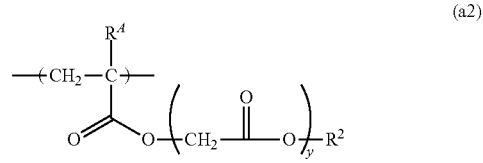

(a2)

wherein $R^A$ is hydrogen or methyl, $R^2$ is a $C_4$-$C_{15}$ monovalent cyclic hydrocarbon group having a structure selected from a cyclic ester, cyclic carbonate, and cyclic sulfonate, and y is 0 or 1.

4. The pattern forming process of claim 1 wherein the polymer includes recurring units (a3) having a carboxyl group.

5. The pattern forming process of claim 1 wherein the developer used in step (iv) comprises at least 60% by weight of at least one organic solvent selected from the group consisting of 2-octanone, 2-nonanone, 2-heptanone, 3-heptanone, 4-heptanone, 2-hexanone, 3-hexanone, diisobutyl ketone, 2-methylcyclohexanone, 3-methylcyclohexanone, 4-methylcyclohexanone, acetophenone, 2'-methylacetophenone, 4'-methylacetophenone, butyl acetate, isobutyl acetate, pentyl acetate, isopentyl acetate, phenyl acetate, methyl valerate, methyl 2-hydroxyisobutyrate, ethyl 2-hydroxyisobutyrate, methyl benzoate, ethyl benzoate, benzyl acetate, methyl phenylacetate, and methyl 3-phenylpropionate.

6. The pattern forming process of claim 1 wherein the acid labile group is selected from groups having the following formulae (L1) to (L8),

(L1)

(L2)

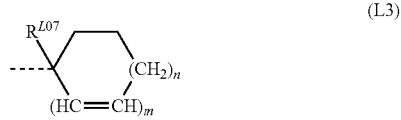

(L3)

-continued

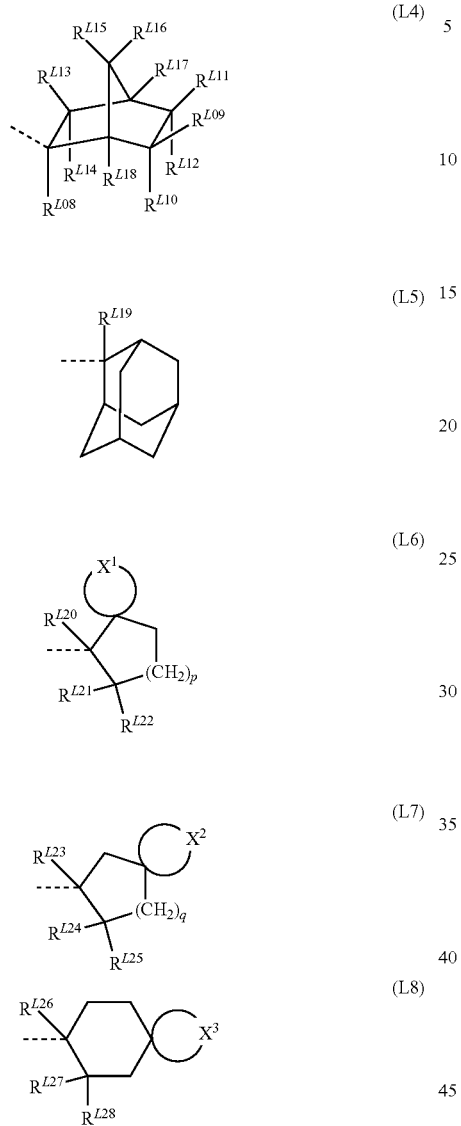

(L4)

(L5)

(L6)

(L7)

(L8)

wherein $R^{L01}$ and $R^{L02}$ are each independently hydrogen or a $C_1$-$C_{18}$, preferably $C_1$-$C_{10}$ alkyl group, $R^{L03}$ is a $C_1$-$C_{18}$ monovalent hydrocarbon group which may contain a heteroatom, a pair of $R^{L01}$ and $R^{L02}$, $R^{L01}$ and $R^{L03}$, or $R^{L02}$ and $R^{L03}$ may bond together to form a ring with the carbon and oxygen atom to which they are attached, $R^{L04}$, $R^{L05}$ and $R^{L06}$ are each independently a $C_1$-$C_{15}$ alkyl group, $R^{L07}$ is a $C_1$-$C_{10}$ alkyl group which may contain a heteroatom or a $C_6$-$C_{20}$ aryl group which may contain a heteroatom, m is an integer of 0 or 1, n is an integer of 0 to 3, and 2m+n is equal to 2 or 3, $R^{L08}$ is a $C_1$-$C_{10}$ alkyl group which may contain a heteroatom or a $C_6$-$C_{20}$ aryl group which may contain a heteroatom, $R^{L09}$ to $R^{L18}$ are each independently hydrogen or a $C_1$-$C_{15}$ monovalent hydrocarbon group, two of $R^{L09}$ to $R^{L18}$ may bond together to form a ring with the carbon atom to which they are attached, a ring-forming combination of R's is a divalent $C_1$-$C_{15}$ hydrocarbon group, two of $R^{L09}$ to $R^{L18}$ which are attached to vicinal carbon atoms may bond together directly to form a double bond, $R^{L19}$ is a $C_1$-$C_{10}$ alkyl group which may contain a heteroatom or a $C_6$-$C_{20}$ aryl group which may contain a heteroatom, $R^{L20}$ is a $C_1$-$C_{10}$ alkyl group which may contain a heteroatom or a $C_6$-$C_{20}$ aryl group which may contain a heteroatom, $R^{L21}$ to $R^{L22}$ are each independently hydrogen or a $C_1$-$C_{10}$ monovalent hydrocarbon group, $R^{L21}$ and $R^{L22}$ may bond together to form a substituted or unsubstituted cyclopentane or cyclohexane ring with the carbon atom to which they are attached, $X^1$ is a divalent group which forms a substituted or unsubstituted cyclopentane, cyclohexane or norbornane ring with the carbon atom to which it is attached, the subscript p is 1 or 2, $R^{L23}$ is a $C_1$-$C_{10}$ alkyl group which may contain a heteroatom or a $C_6$-$C_{20}$ aryl group which may contain a heteroatom, $R^{L24}$ and $R^{L25}$ are each independently hydrogen or a $C_1$-$C_{10}$ monovalent hydrocarbon group, $R^{L24}$ and $R^{L25}$ may bond together to form a substituted or unsubstituted cyclopentane or cyclohexane ring with the carbon atom to which they are attached, $X^2$ is a divalent group which forms a substituted or unsubstituted cyclopentane, cyclohexane or norbornane ring with the carbon atom to which it is attached, the subscript q is 1 or 2, $R^{L26}$ is a $C_1$-$C_{10}$ alkyl group which may contain a heteroatom or a $C_6$-$C_{20}$ aryl group which may contain a heteroatom, $R^{L27}$ and $R^{L28}$ are each independently hydrogen or a $C_1$-$C_{10}$ monovalent hydrocarbon group, $R^{L27}$ and $R^{L28}$ may bond together to form a substituted or unsubstituted cyclopentane or cyclohexane ring with the carbon atom to which they are attached, $X^3$ is a divalent group which forms a substituted or unsubstituted cyclopentane, cyclohexane or norbornane ring with the carbon atom to which it is attached.

7. A composition for forming a protective film between a substrate and a resist film, the composition consisting of
(A) a polymer consisting of recurring units (a1) having a carboxyl group protected with an acid labile group and recurring units (a2) having a structure selected from a cyclic ester, cyclic carbonate, and cyclic sulfonate, and optionally recurring units (a3) having a carboxyl group, recurring units (a4) having a polar group such as hydroxyl, amino, amide, carbamate or cyano, but not an aromatic ring and/or recurring units (a5) having an aromatic ring,
(B) a thermal acid generator,
(C) an organic solvent, and
optionally at least one selected from the group consisting of a basic compound and a surfactant.

8. The composition of claim 7 wherein the recurring units (a1) have the formula (a1):

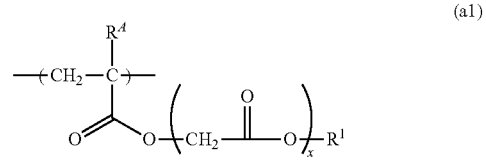

(a1)

wherein $R^A$ is hydrogen or methyl, $R^1$ is an acid labile group, and x is 0 or 1.

9. The composition of claim 8 wherein the recurring unit (a1) is selected from the group consisting of the following formulae:
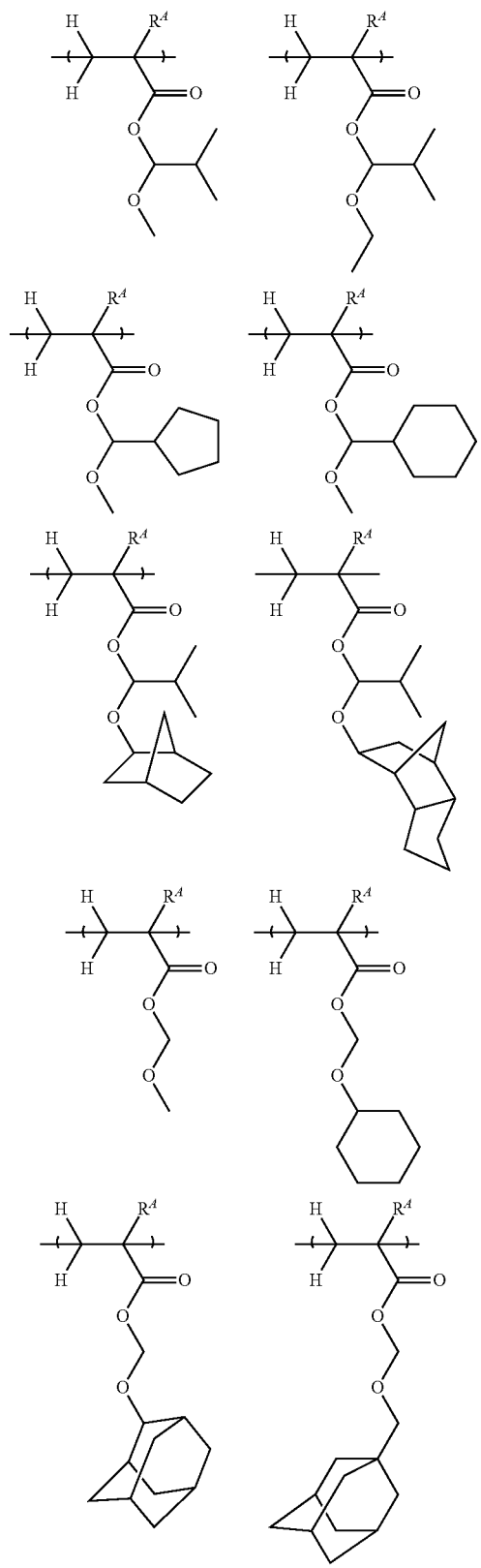
-continued
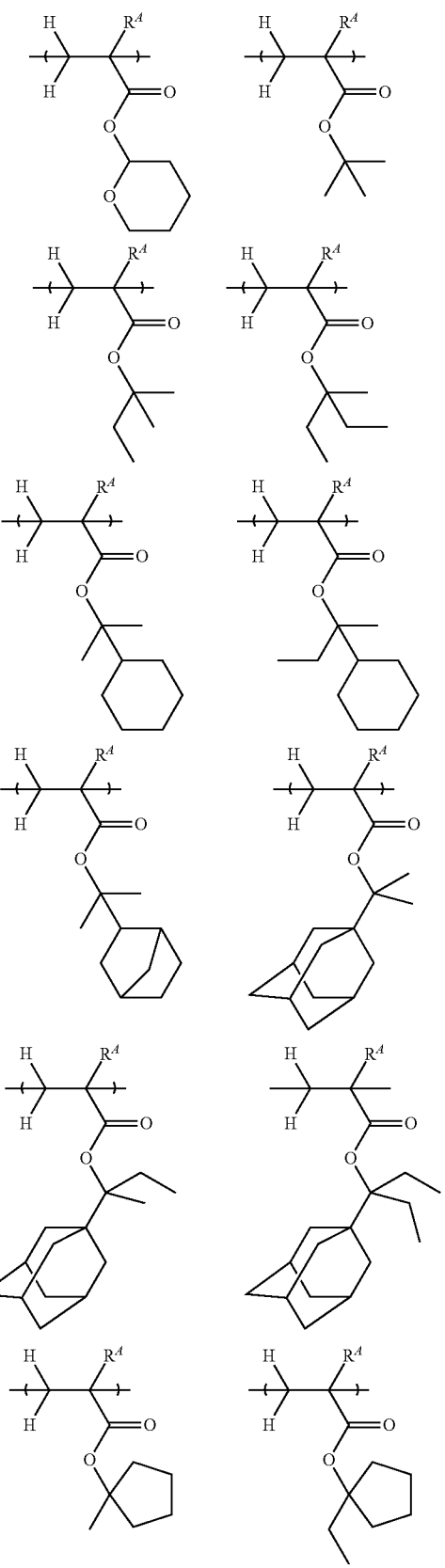

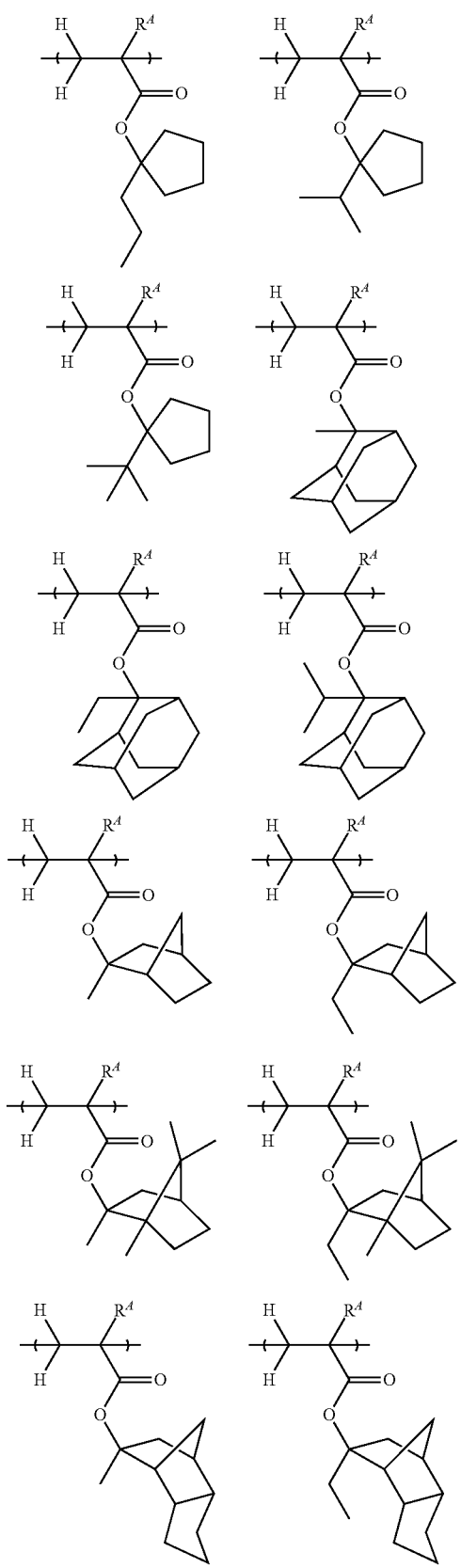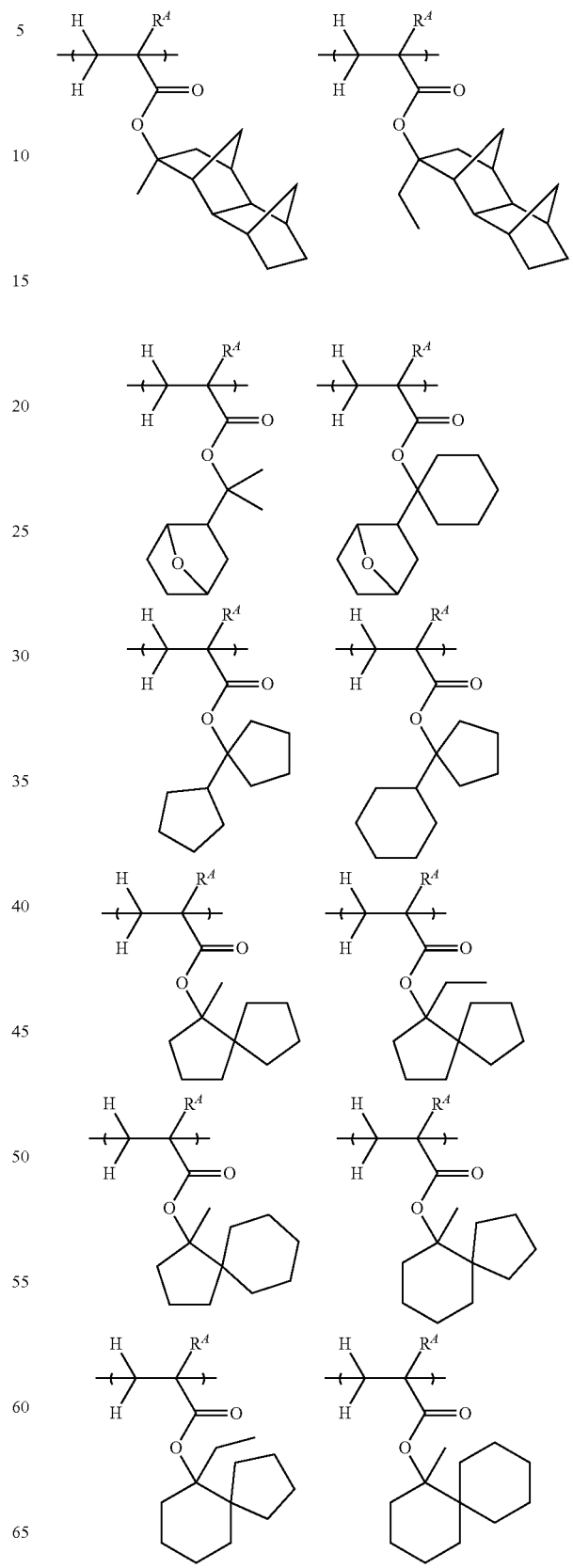

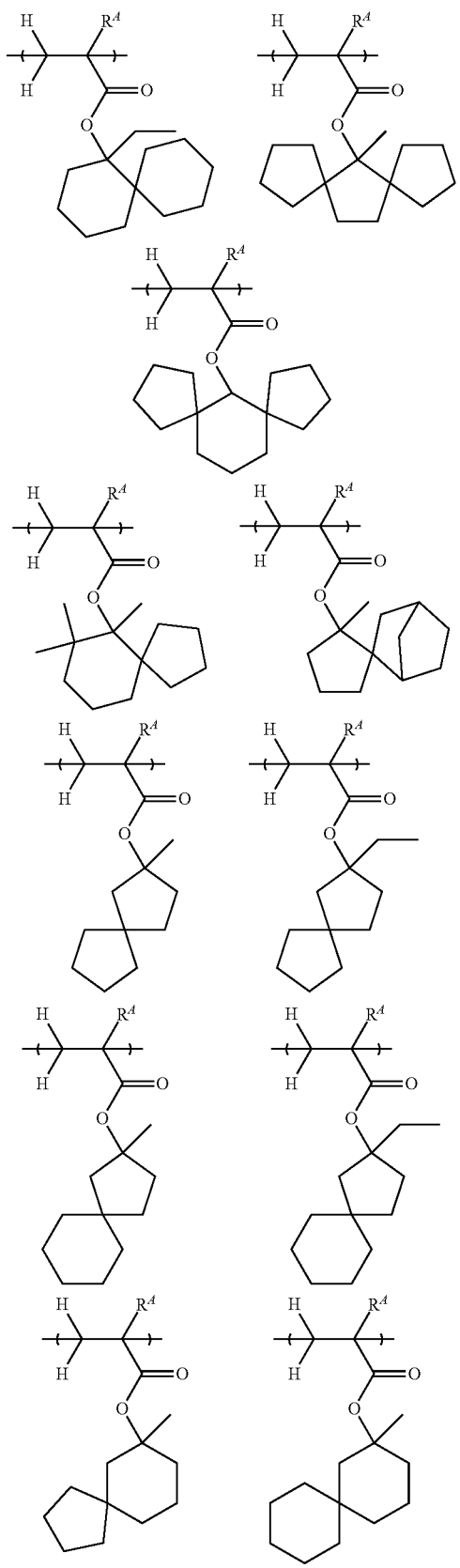
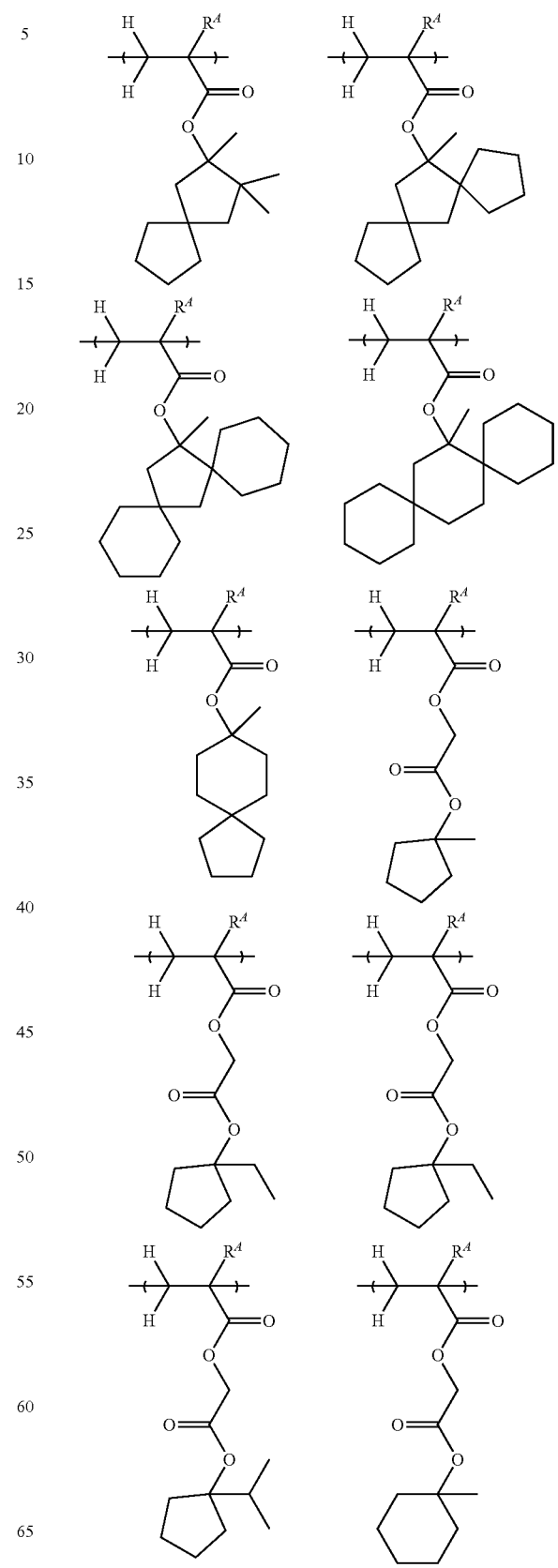

-continued

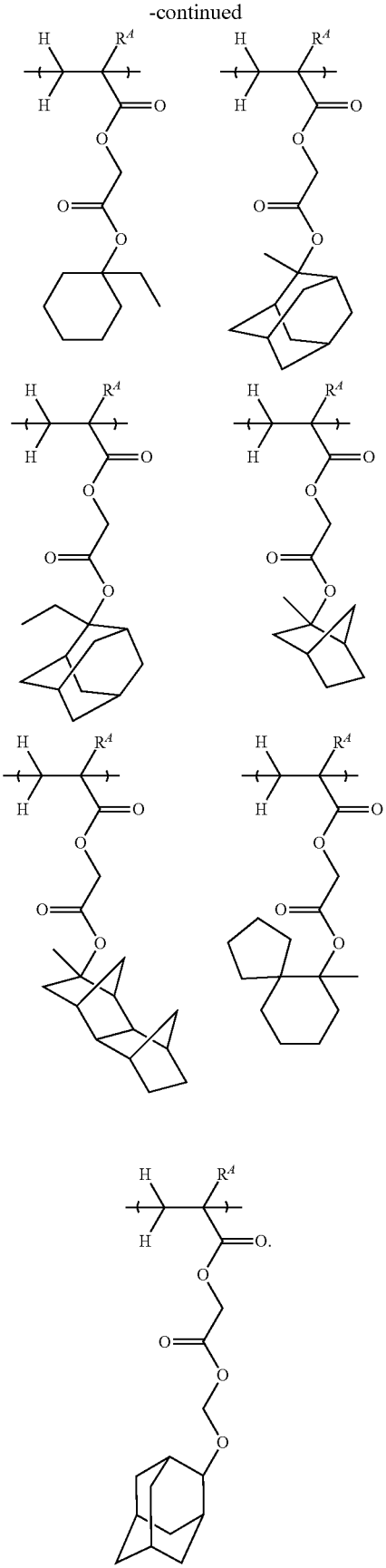

10. The composition of claim 7 wherein the recurring units (a2) have the formula (a2):

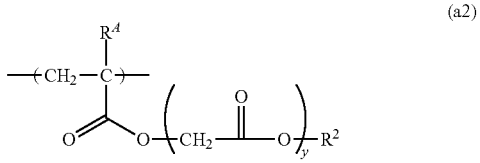

wherein $R^A$ is hydrogen or methyl, $R^2$ is a $C_4$-$C_{15}$ monovalent cyclic hydrocarbon group having a structure selected from a cyclic ester, cyclic carbonate, and cyclic sulfonate, and y is 0 or 1.

11. The composition of claim 10 wherein the recurring unit (a2) is selected from the group consisting of the following formulae:

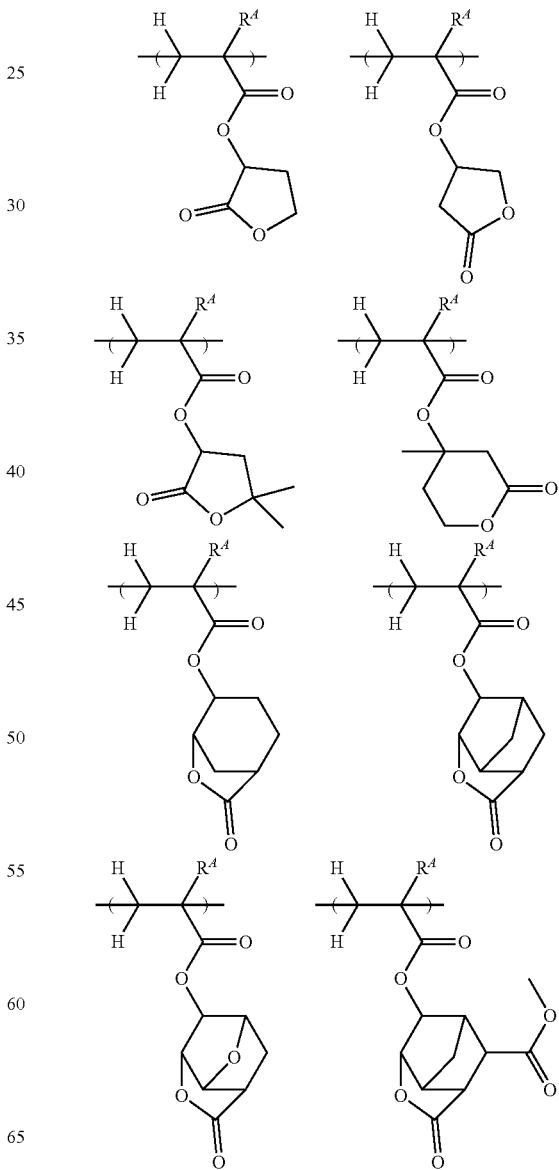

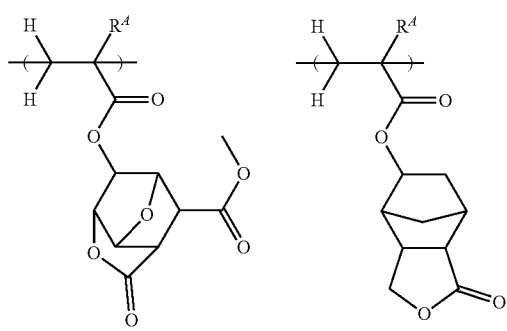
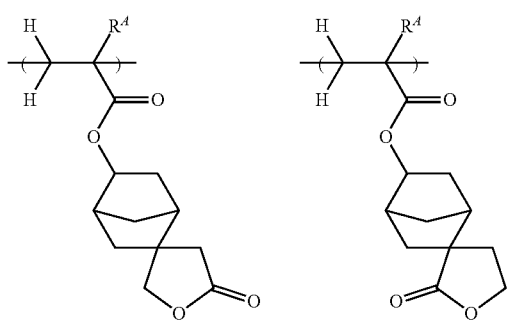
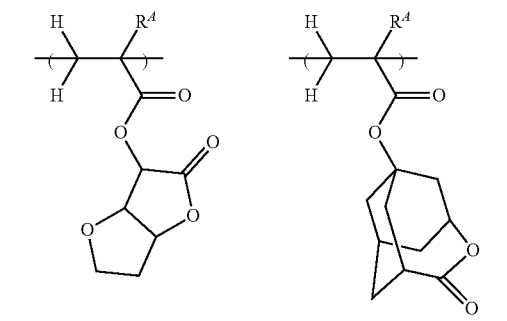
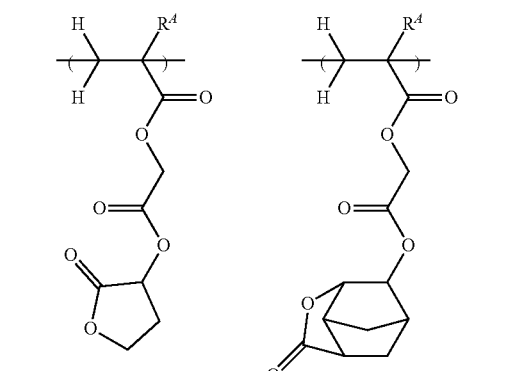
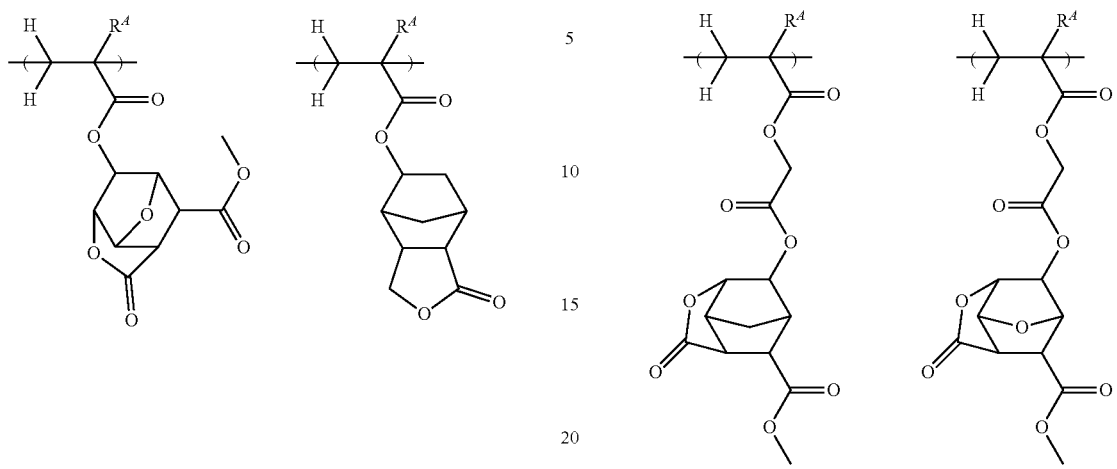
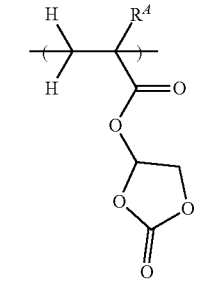
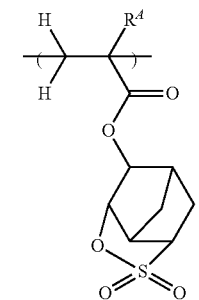
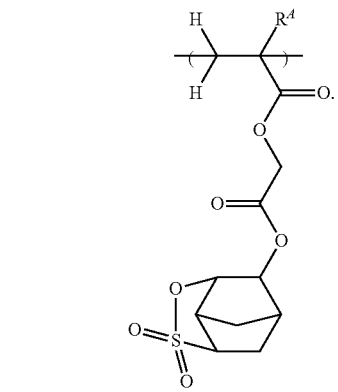

12. The composition of claim 7 wherein the recurring unit (a3) is selected from the group consisting of the following formulae:
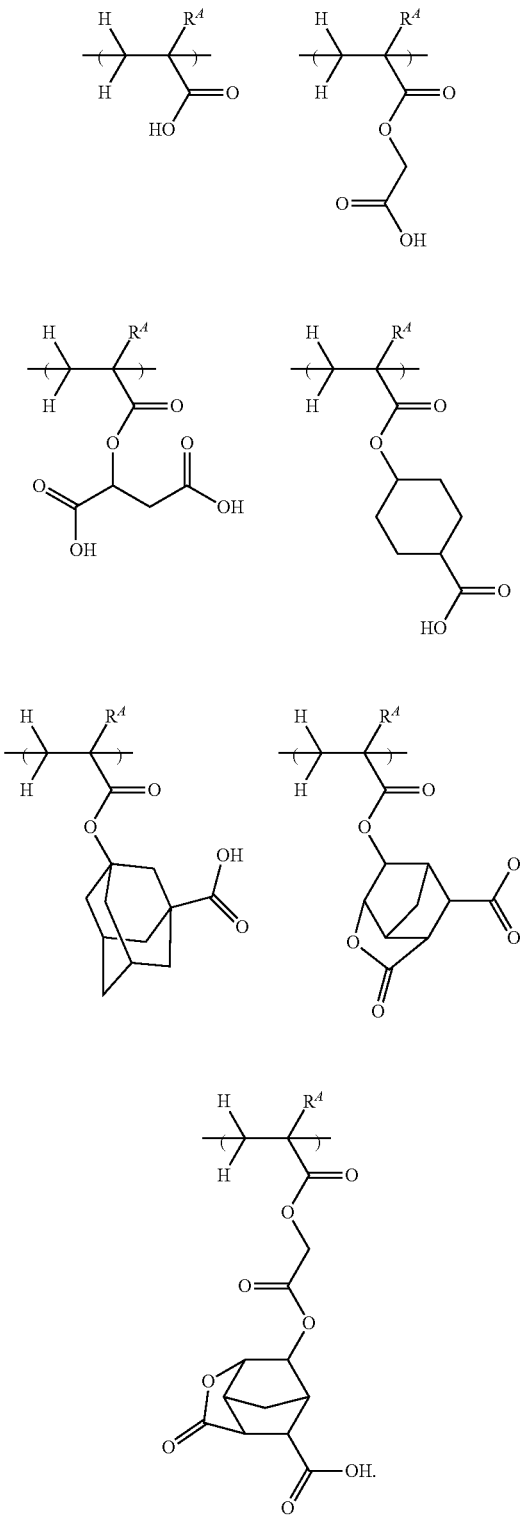
13. The composition of claim 7 wherein the recurring unit (a4) is selected from the group consisting of the following formulae:
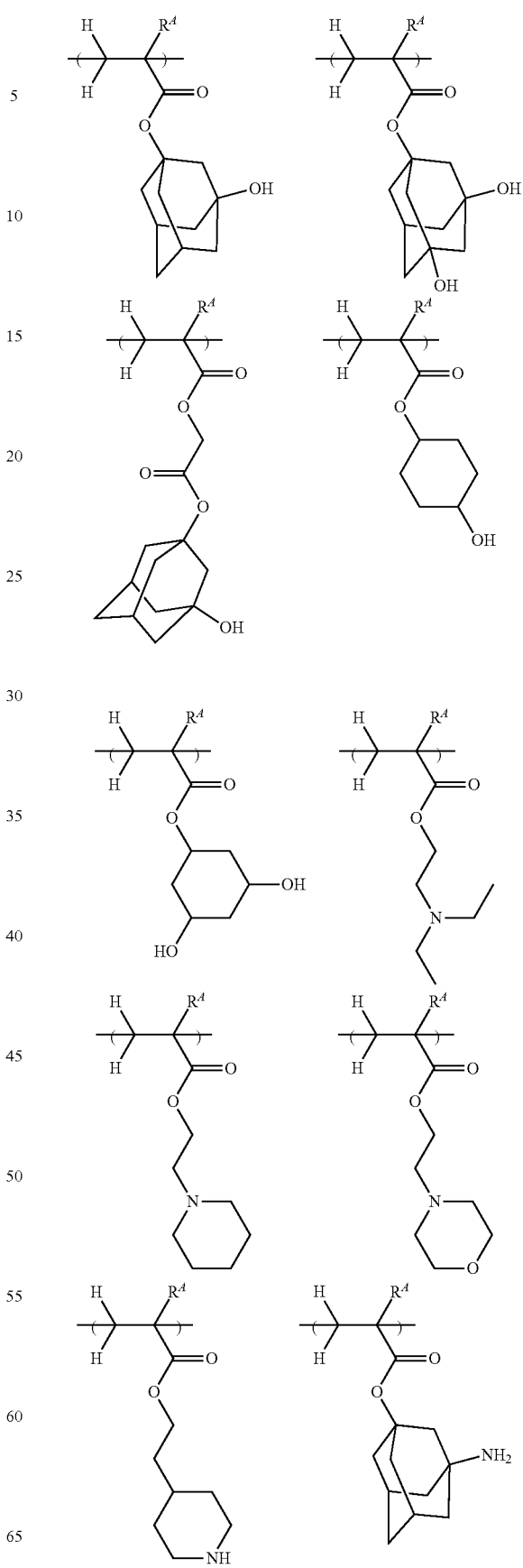

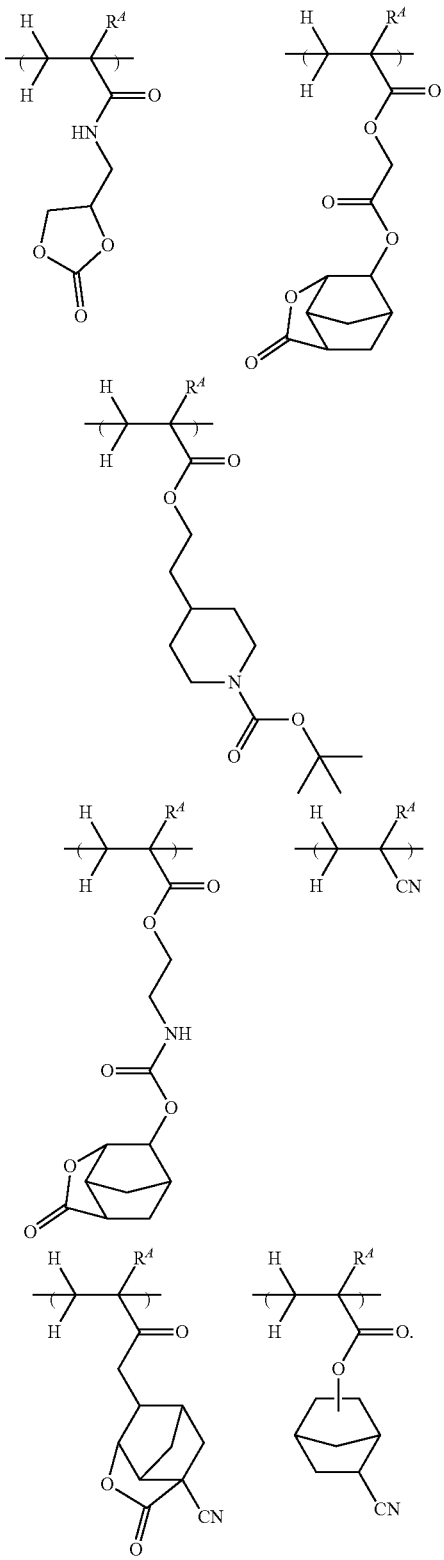
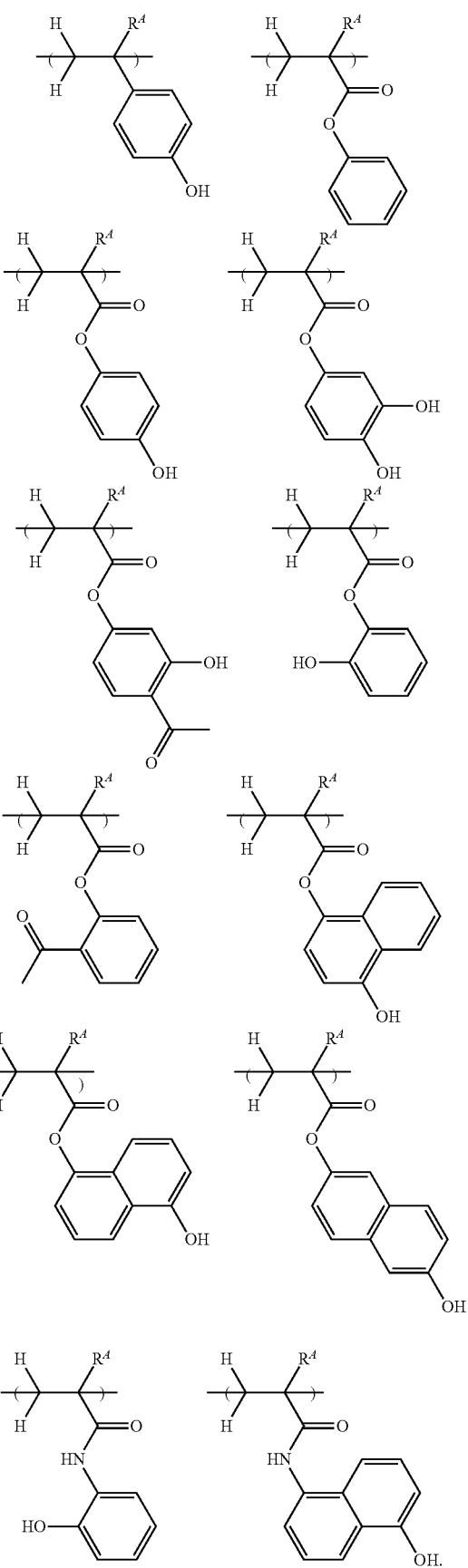
14. The composition of claim 7 wherein the recurring unit (a5) is selected from the group consisting of the following formulae:

15. A pattern forming process comprising the steps of:
(i) applying the substrate protective film-forming composition of claim 7 to a substrate to form a protective film thereon,
(ii) applying a resist material on the protective film to form a resist film thereon,
(iii) exposing the resist film to high-energy radiation,
(iv) developing the exposed resist film in a developer, and
(v) dissolving away the protective film in entirety or in a selected portion using an organic solvent or basic aqueous solution.

* * * * *